United States Patent
San et al.

(10) Patent No.: US 8,436,757 B2
(45) Date of Patent: May 7, 2013

(54) COMPLEX BANDPASS ΔΣAD MODULATOR AND DIGITAL RADIO RECEIVER

(75) Inventors: Hao San, Kiryu (JP); Haruo Kobayashi, Kiryu (JP)

(73) Assignee: National University Corporation Gunma University, Maebashi-shi (JP)

( * ) Notice: Subject to any disclaimer, the term of this patent is extended or adjusted under 35 U.S.C. 154(b) by 59 days.

(21) Appl. No.: 13/254,333

(22) PCT Filed: Feb. 24, 2010

(86) PCT No.: PCT/JP2010/052873
§ 371 (c)(1),
(2), (4) Date: Sep. 1, 2011

(87) PCT Pub. No.: WO2010/101058
PCT Pub. Date: Sep. 10, 2010

(65) Prior Publication Data
US 2011/0316729 A1    Dec. 29, 2011

(30) Foreign Application Priority Data
Mar. 4, 2009   (JP) ................................. 2009-050714

(51) Int. Cl.
*H03M 3/00*   (2006.01)
(52) U.S. Cl.
USPC ........... 341/143; 341/155; 375/316; 375/324; 375/327; 375/332
(58) Field of Classification Search .................. 341/143, 341/155; 375/324, 344, 247, 269, 316, 332, 375/345, 346
See application file for complete search history.

(56) References Cited

U.S. PATENT DOCUMENTS

| 5,764,171 A | * | 6/1998 | Stikvoort .................... 341/143 |
| 6,590,943 B1 | | 7/2003 | Ali et al. |

(Continued)

FOREIGN PATENT DOCUMENTS

| JP | 2002-527978 | 8/2002 |
| JP | 2006-13705 | 1/2006 |

(Continued)

OTHER PUBLICATIONS

Kenneth W. Martin, "Complex Signal Processing Is Not Complex", IEEE Transactions on Circuits and Systems, vol. 51, No. 9, Sep. 2004, pp. 1823-1836.

(Continued)

*Primary Examiner* — Linh Nguyen
(74) *Attorney, Agent, or Firm* — Oblon, Spivak, McClelland, Maier & Neustadt, L.L.P.

(57) ABSTRACT

To provide a complex bandpass ΔΣAD modulator capable of suppressing the influence of an image component caused by a mismatch between I- and Q-channels on a signal component with low power consumption.
A complex bandpass ΔΣAD modulator 10 is configured by a subtraction unit 20, a complex bandpass filter 30, an addition unit 40, a noise extraction circuit unit 50, an ADC unit 60, and a DAC unit 70. The noise extraction circuit unit 50 extracts a quantized noise signal of the ADC unit 60 based on an input signal of the ADC unit 60 and an output signal of the DAC unit 70, delays the extracted quantized noise signal by one sample time, phase-rotates the delayed signal by a predetermined angle, and feeds back the rotated signal to the input side of the ADC unit 60. Thus, a complex bandpass ΔΣAD modulator capable of suppressing the influence of the image component caused by a mismatch between I- and Q-channels on the signal component with low power consumption is provided.

5 Claims, 14 Drawing Sheets

U.S. PATENT DOCUMENTS

| | | | |
|---|---|---|---|
| 6,801,148 B2 * | 10/2004 | Freeman et al. | 341/143 |
| 7,173,980 B2 * | 2/2007 | Masenten et al. | 375/316 |
| 7,194,036 B1 * | 3/2007 | Melanson | 375/247 |
| 7,420,494 B1 * | 9/2008 | Schreier | 341/143 |
| 7,525,460 B1 * | 4/2009 | Liu et al. | 341/120 |
| 7,583,214 B2 * | 9/2009 | Liu et al. | 341/143 |
| 7,675,445 B2 * | 3/2010 | Robbe et al. | 341/142 |
| 7,756,472 B2 * | 7/2010 | Darabi et al. | 455/20 |
| 8,294,605 B1 * | 10/2012 | Pagnanelli | 341/144 |
| 2005/0285766 A1 * | 12/2005 | San et al. | 341/143 |
| 2006/0038708 A1 * | 2/2006 | Luh et al. | 341/143 |
| 2006/0284751 A1 | 12/2006 | San et al. | |
| 2007/0058755 A1 * | 3/2007 | Husted | 375/332 |

FOREIGN PATENT DOCUMENTS

| | | |
|---|---|---|
| JP | 2006-352455 | 12/2006 |
| JP | 3970266 B2 | 9/2007 |
| JP | 3992287 B2 | 10/2007 |

OTHER PUBLICATIONS

Hao San et al., "Complex Noise-Coupled Bandpass $\Delta\Sigma$AD Modulator", IEICE, Mar. 18, 2008, p. 9. (with English translation).

Hao San et al., "Noise-Coupled Complex Bandpass $\Delta\Sigma$AD Modulators", The 21$^{st}$ Workshop on Circuits and Systems in Karuizawa, Apr. 21-22, 2008, pp. 75-80. (with English translation).

Stephen A. Jantzi et al., "Quadrature Bandpass $\Delta\Sigma$ Modulation for Digital Radio", IEEE Journal of Solid-State Circuits, vol. 32, No. 12, Dec. 1997, pp. 1935-1950.

Hao San et al., "Complex Bandpass $\Delta\Sigma$AD Modulator With Noise-Coupled Architecture", IEEE, 2008, pp. 486-489.

Hajime Konagaya et al., "Feedforward $\Delta\Sigma$AD Modulators With Noise-Coupled Architecture", The 21$^{st}$ Workshop on Circuits and Systems in Karuizawa, Apr. 21-22, 2008, pp. 69-74. (with English translation).

* cited by examiner

COMPLEX BANDPASS ΔΣAD MODULATOR AND DIGITAL RADIO RECEIVER

TECHNICAL FIELD

The present invention relates to a complex bandpass ΔΣAD modulator and a digital radio receiver including the same for use, for example, in a radio communication system.

BACKGROUND ART

Conventionally, in an RF (Radio Frequency) receiver for the radio communication systems such as a wireless LAN (Local Area Network) and a mobile telephone, a Low-IF (Low-Intermediate Frequency) system is applied frequently. In recent years, application of a bandpass ΔΣAD (Delta Sigma Analog to Digital) modulator to such a Low-IF system receiver has been discussed.

One of application examples of the bandpass ΔΣAD modulator to a Low-IF system receiver includes a technique that uses two real bandpass ΔΣAD modulators (one-input one-output). In this technique, not only the signal component but also the image component of an input signal is subjected to AD conversion in the real bandpass ΔΣD modulator. Hence, this technique has such a problem as power consumption increases which is inefficient.

As a technique to solve the above-mentioned problem, application of a complex bandpass ΔΣAD modulator with two-input and two-output to a Low-IF system receiver is proposed (for example, see Patent Documents 1 to 4). The transfer function of a complex bandpass ΔΣAD modulator is designed so that asymmetric spectral characteristics can be obtained for a DC region (direct-current region) and only the signal component is subjected to AD conversion. Therefore, when a complex bandpass ΔΣAD modulator is used, a high SQNDR (Signal to Quantization Noise and Distortion Ratio) can be obtained with low power consumption and a highly efficient AD conversion may be made.

Here, the configuration and characteristics of a general complex bandpass ΔΣAD modulator are explained with reference to the drawings. FIGS. 14 and 15 show a schematic circuit configuration of a complex bandpass ΔΣAD modulator. FIG. 14 is a diagram showing the signal flow of a complex bandpass ΔΣAD modulator and FIG. 15 is a diagram showing the configuration of a complex bandpass ΔΣAD modulator more specifically.

As shown in FIG. 14, a complex bandpass ΔΣAD modulator 300 is configured mainly by a subtraction unit 310, a complex bandpass filter 320, an analog-to-digital converter 330 (hereinafter, referred to as an ADC unit), and a digital-to-analog converter 340 (hereinafter, referred to as a DAC unit). Normally, the complex bandpass filter 320 is configured by connecting cascade integrator circuits including an operational amplifier. The connection relationship of each unit is described below.

The input terminal of the subtraction unit 310 is connected to the input terminal (not shown) of an input complex signal X(z) (hereinafter, simply referred to as an input signal X(z)) input from the outside and the output terminal of the DAC unit 340, and the output terminal of the subtraction unit 310 is connected to the input terminal of the complex bandpass filter 320. The output terminal of the complex bandpass filter 320 is connected to the input terminal of the ADC unit 330. Then, the output terminal of the ADC unit 330 is connected to the output terminal (not shown) of an output signal Y(z) and the input terminal of the DAC unit 340.

As shown in FIG. 15, the circuit in the complex bandpass ΔΣAD modulator 300 is separated into a channel 301 in which an in-phase component $I_{in}$ of the input signal X(z) is processed (hereinafter, referred to as an I-channel) and a channel 302 in which an orthogonal component $Q_{in}$ is processed (hereinafter, referred to as a Q-channel). Thus, the subtraction unit 310 is configured by two subtractors 311 and 312 arranged in the I-channel 301 and the Q-channel 302, respectively. The ADC unit 330 is configured by two AD converters (quantizers) 331 and 332 arranged in the I-channel 301 and the Q-channel 302, respectively. Further, the DAC unit 340 is also configured by two DA converters 341 and 342 arranged in the I-channel 301 and the Q-channel 302, respectively.

In the complex bandpass ΔΣAD modulator 300, the signal X(z) ($=I_{in}+jQ_{in}$: j is an imaginary number) in a complex form including the in-phase component $I_{in}$ and the orthogonal component $Q_{in}$ is input and the signal Y(z) ($=I_{out}+jQ_{out}$) in a complex form including an in-phase component $I_{out}$ and an orthogonal component $Q_{out}$ is output from the complex bandpass ΔΣAD modulator 300. X(z) and Y(z) in FIG. 14 represent continuous input and output signals which have been subjected to z conversion, respectively. A variable z is represented by the following formula.

$$z = \exp(j2\omega T_s) = \exp\{j2\pi(F_{in}/F_s)\} \quad \text{Formula 1}$$

Here, $T_s$ in Formula 1 described above is a sampling period, $F_s$ is a sampling frequency, and $F_{in}$ is an input signal frequency.

If it is assumed that a transfer function of the complex bandpass filter 320 is H(z) and a quantized noise of the ADC unit 330 is $E(z)=E_I+jE_Q$, the output signal Y(z) is represented by the following formula.

$$Y(z) = I_{out} + jQ_{out} = \frac{H(z)}{1+H(z)}(I_{in}+jQ_{in}) + \frac{1}{1+H(z)}(E_I+jE_Q) \quad \text{Formula 2}$$

A coefficient $1/\{1+H(z)\}$ of the second term on the right side in the above formula 2 is a transfer function for the quantized noise E(z) and referred to as a noise transfer function NTF. The complex bandpass ΔΣAD modulator 300 is designed such that the zero point of the noise transfer function NTF(z) (the solution of z that satisfies NTF(z)=0) is generated within the frequency band of the signal component of the input signal, that is, the quantized noise E(z) is attenuated in the frequency band of the signal component. Such a technique as to adjust (design) the noise transfer function NTF(z) so that the quantized noise E(z) is attenuated in a desired frequency band is referred to as a noise shape technique.

For example, in order to perform the noise shape such that the quantized noise E(z) is attenuated in a band in the vicinity of $F_{in}/F_s$ 0.25, to which the frequency band of the signal component (hereinafter, referred to as a signal band) is set, the design is made so that the noise transfer function satisfies $NTF(z)=(1-jz^{-1})^N$, that is, the zero point of the noise transfer function NTF(z) satisfies z=j (corresponding to $F_{in}/F_s=0.25$, see Formula 1 described above). Here, N is the order of the modulator, and an integer of 1 or more.

FIG. 16 shows an example of output power spectra of the complex bandpass ΔΣAD modulator 300 designed as described above. The horizontal axis in FIG. 16 represents the frequency, which is the input signal frequency $F_{in}$ normalized by the sampling frequency $F_s$, and the vertical axis represents the level of the output power of the complex bandpass ΔΣAD modulator 300. Further, FIG. 16 shows spectral characteristics in a range of $F_{in}/F_s$=0.5 to −0.5. As is obvious from FIG. 16, by designing the complex bandpass ΔΣAD modulator 300 as described above, noises are reduced in the vicinity of $F_{in}/F_s$=0.25 (signal band).

As a complex bandpass ΔΣAD modulator having a configuration other than that shown in FIG. 14, conventionally, for example, a feed-forward type complex bandpass ΔΣAD modulator is proposed (for example, see Non-Patent Document 1). A schematic configuration of the feed-forward type complex bandpass ΔΣAD modulator is shown in FIG. 17. The same reference numerals that designate corresponding members in the complex bandpass ΔΣAD modulator 300 shown in FIG. 14 are used in FIG. 17. In this type, an addition unit 430 is provided between a complex bandpass filter 420 and the ADC unit 330, and the input signal X(z) of a complex bandpass ΔΣAD modulator 400 and an output signal of the complex bandpass filter 420 are added by the addition unit 430. In the complex bandpass ΔΣAD modulator 400 having such a configuration, it is also possible to obtain the same output power spectra as those in FIG. 16 by appropriately designing the transfer function H(z) of the complex bandpass filter 420.

Further, a noise-coupling type complex bandpass ΔΣAD modulator has been also proposed conventionally (for example, see Non-Patent Documents 2 and 3). A schematic configuration of the noise-coupling type complex bandpass ΔΣAD modulator is shown in FIG. 18. The same reference numerals that designate corresponding members in the complex bandpass ΔΣAD modulator 300 shown in FIG. 14 are used in FIG. 18. A noise-coupling type complex bandpass ΔΣAD modulator 500 includes a noise extraction circuit unit 540 configured to extract a quantized noise of the ADC unit 330 and feeds back the extracted quantized noise to the input side of the ADC unit 330 (inputs to an addition unit 530). Incidentally, when the extracted quantized noise is input to the addition unit 530, the signal is inverted before input. In this type of complex bandpass ΔΣAD modulator 500, it is possible to increase the order of the modulator in the signal band without increasing the number of stages (the number of operational amplifiers) of the integrator circuit in a complex bandpass filter 520. Thus, a higher-order AD conversion is made with low power consumption.

However, in the actual circuit of the various types of complex bandpass ΔΣAD modulators described above, there exist variations in capacitance in the circuit. Hence, a mismatch between the I-channel in which the in-phase component $I_{in}$ of the input signal is processed and the Q-channel in which the orthogonal component $Q_{in}$ is processed (deviation in amplitude or phase between signals) is created. If a mismatch is created between I- and Q-channels, a complex conjugate of the frequency response is caused and a quantized noise of the image component is produced in a desired signal band (a quantized noise of the image component enters into a desired signal band). As a result, such a problem as SQNDR is reduced in the signal band is caused. Here, this problem is explained more specifically.

In FIG. 19, an equivalent circuit of a complex bandpass ΔΣAD modulator when a mismatch is created between I- and Q-channels is shown. An example in which a mismatch between I- and Q-channels in the complex bandpass ΔΣAD modulator shown in FIG. 15 is created is shown in FIG. 19. In FIG. 19, the same reference numerals that designate corresponding members in the complex bandpass ΔΣAD modulator 300 shown in FIG. 15 are used.

Here, a case is considered, where the signal amplitude of the in-phase component is larger than a predetermined amplitude by an amount corresponding to an amount of mismatch α and the signal amplitude of the orthogonal component is smaller than a predetermined amplitude by an amount corresponding to the amount of mismatch α. This mismatch is represented by integration blocks 351 and 352 provided in the I- and Q-channels in FIG. 19, respectively. In this case, the output signal Y(z)=$I_{out}$+$jQ_{out}$ is represented by the following formula.

$$I_{out} + jQ_{out} = \frac{H + (1-\alpha^2)H^2}{1+2H+(1-\alpha^2)H^2}(I_{in} + jQ_{in}) + \frac{\alpha H}{1+2H+(1-\alpha^2)H^2}(I_{in} - jQ_{in}) + \frac{1+H}{1+2H+(1-\alpha^2)H^2}(E_I + jE_Q) + \frac{\alpha H}{1+2H+(1-\alpha^2)H^2}(E_I + jE_Q)$$

Formula 3

When a mismatch is created between I- and Q-channels, on the right side of Formula 3 described above that represents the output signal Y(z), the term of the image component ($I_{in}$−$jQ_{in}$) of the input signal and the term of the image component ($E_I$−$jE_Q$) of the quantized noise appear. These image components enter into the signal band and cause the reduction in SQNDR of the signal component as is shown in FIG. 20.

FIG. 20 shows an example of the output power spectra of the complex bandpass ΔΣAD modulator when a mismatch is created between I- and Q-channels. The horizontal axis in FIG. 20 represents the normalized frequency $F_{in}/F_s$ and the vertical axis represents the output power level. In the example in FIG. 20, the design is made so that the noise transfer function NTF(z) of the complex bandpass ΔΣAD modulator satisfies NTF(z)=$(1-jz^{-1})^N$. Thus, in the range of the normalized frequency $F_{in}/F_s$=0.5 to −0.5 shown in FIG. 20, the signal band is in the vicinity of the $F_{in}/F_s$=0.25 like the example in FIG. 16 and the frequency band of the image component (hereinafter, referred to as an image band) is in the vicinity of $F_{in}/F_s$=−0.25.

As is obvious from FIG. 20, when a mismatch is created between I- and Q-channels, the noise level increases in the image band (in the vicinity of $F_{in}/F_s$=−0.25). As a result, the noise level in the signal band (in the vicinity of $F_{in}/F_s$=0.25) also increases, and SQNDR in the signal band is reduced.

In order to solve the problem of the mismatch between I- and Q-channels described above, a technique, in which a complex bandpass ΔΣAD modulator is configured such that the zero point of the noise transfer function NTF(z) is generated not only in the signal band but also in the image band (for example, see Non-Patent Document 4), has conventionally been proposed. Specifically, in Non-Patent Document 4, the above-mentioned problem is solved by separately providing an integrator circuit (including an operational amplifier) in the complex bandpass ΔΣAD modulator to generate the zero point (attenuation pole) in the image band.

FIG. 21 shows the gain characteristics of the noise transfer function NTF(z) of the complex bandpass ΔΣAD modulator proposed in Non-Patent Document 4. The horizontal axis in FIG. 21 represents the normalized frequency and the vertical axis represents the gain of the noise transfer function NTF(z). In the example in FIG. 21, the normalized frequency of the signal band is in the vicinity of 0.5 and the image band is in the vicinity of −0.5.

In the complex bandpass ΔΣAD modulator in Non-Patent Document 4, because the zero point of the noise transfer function NTF(z) is generated not only in the signal band but also in the image band, in the gain characteristics of the noise transfer function NTF(z), attenuation poles (notches) are generated at the normalized frequency±0.5 as shown in FIG. 21. In this case, even if a mismatch is created between I- and Q-channels, the image component is reduced and the reduction in SQNDR in the signal band is suppressed.

[Patent Document 1] Japanese Patent No. 3970266
[Patent Document 2] Japanese Patent No. 3992287
[Patent Document 3] Japanese Unexamined Patent Publication No. 2006-13705
[Patent Document 4] Japanese Unexamined Patent Publication No. 2006-352455
[Non-Patent Document 1] K. W. Martin: "Complex Signal Processing is Not Complex", IEEE Trans. on Circuits Syst. I, vol. 51, no. 9, pp. 1823-1836, September 2004
[Non-Patent Document 2] Hao San, Haruo Kobayashi: "Complex Bandpass $\Delta\Sigma$AD Modulator with Noise-coupled Architecture", Proceedings of IEICE General Conference on Fundamentals, A-1-9, 2008
[Non-Patent Document 3] Hao San, Haruo Kobayashi: "Complex Bandpass $\Delta\Sigma$AD Modulator with Noise-coupled Architecture", Proceedings of the 21st Karuizawa Workshop on Circuits and Systems, pp. 75-80, 2008
[Non-Patent Document 4] S. Jantzi, et al.: "Quadrature bandpass $\Delta\Sigma$ modulator for digital radio", IEEE Journal of Solid-State Circuits, vol. 32, p. 1935-1949, December 1997

DISCLOSURE OF THE INVENTION

As described above, in order to solve the problem of the mismatch created between I- and Q-channels of the complex bandpass $\Delta\Sigma$AD modulator, in Non-Patent Document 4, the integrator circuit including an operational amplifier to generate an attenuation pole in the image band is further provided. However, by this technique, because the number of operational amplifiers, which are active circuit elements, is increased, the circuit of the complex bandpass $\Delta\Sigma$AD modulator becomes large in scale and complicated in construction, thereby causing a problem such as power consumption increases.

The present invention has been made in order to solve the above-mentioned problem and an object of the present invention is to provide a complex bandpass $\Delta\Sigma$AD modulator capable of solving the problem of the mismatch created between I- and Q-channels with a simple configuration and low power consumption, and a digital radio receiver including the same.

In order to solve the above-mentioned problem, a complex bandpass $\Delta\Sigma$AD modulator of the present invention has a configuration comprising an analog-to-digital conversion unit, a digital-to-analog conversion unit, a subtraction unit, a complex bandpass filter, a noise extraction circuit unit, and an addition unit, and the function and configuration of each unit are as follows. The analog-to-digital conversion unit is configured to convert an analog complex signal into a digital complex signal. The digital-to-analog conversion unit is configured to convert a complex signal output from the analog-to-digital conversion unit into an analog complex signal. The subtraction unit is configured to subtract a complex signal output from the digital-to-analog conversion unit from an input complex signal input from the outside. The complex bandpass filter is configured to allow a signal component in a predetermined frequency band out of a complex signal output from the subtraction unit to pass through. The noise extraction circuit unit is configured to extract a quantized noise signal of the analog-to-digital conversion unit based on a complex signal input to the analog-to-digital conversion unit and a complex signal output from the digital-to-analog conversion unit, delay the extracted quantized noise signal by one sample time, phase-rotate the delayed signal by a predetermined angle, and feed back the phase-rotated signal to the input side of the analog-to-digital conversion unit. Then, the addition unit is configured to add an input complex signal, a complex signal output from the complex bandpass filter, and a complex signal output from the noise extraction circuit unit and output the added signal to the analog-to-digital conversion unit.

A digital radio receiver of the present invention has a configuration including the complex bandpass $\Delta\Sigma$AD modulator of the present invention described above and a decimation circuit unit configured to perform a predetermined decimation process on an output signal of the complex bandpass $\Delta\Sigma$AD modulator.

In the complex bandpass $\Delta\Sigma$AD modulator of the present invention, the noise extraction circuit unit delays the extracted quantized noise signal by one sample time, phase-rotates it by a predetermined angle, and feeds it back to the input side of the analog-to-digital conversion unit. With this arrangement, it is possible to generate a zero point not only in the signal band but also in the image band in the noise transfer function NTF(z). Further, it is possible to configure the noise extraction circuit unit having the above-described functions by a plurality of capacitors and switches. That is, in the present invention, it is no longer necessary to use an integrator circuit including an active circuit element, such as an operational amplifier, as is conventionally arranged in order to generate an attenuation pole in the image band.

In the complex bandpass $\Delta\Sigma$AD modulator of the present invention, by providing the noise extraction circuit unit that can be configured by passive circuit elements, it is possible to generate an attenuation pole not only in the signal band but also in the image band. Thus, according to the present invention, it is possible to solve the problem of the mismatch created between I- and Q-channels with a simple configuration and low power consumption, and efficient and high-precision AD conversion is made.

DESCRIPTION OF THE PREFERRED EMBODIMENT

Hereinafter, examples of a complex bandpass ΔΣAD modulator and a digital radio receiver including the same according to an embodiment of the present invention are explained with reference to the drawings, however, the present invention is not limited to those examples.

[Outline Configuration of Complex Bandpass ΔΣAD Modulator]

Figure 1:
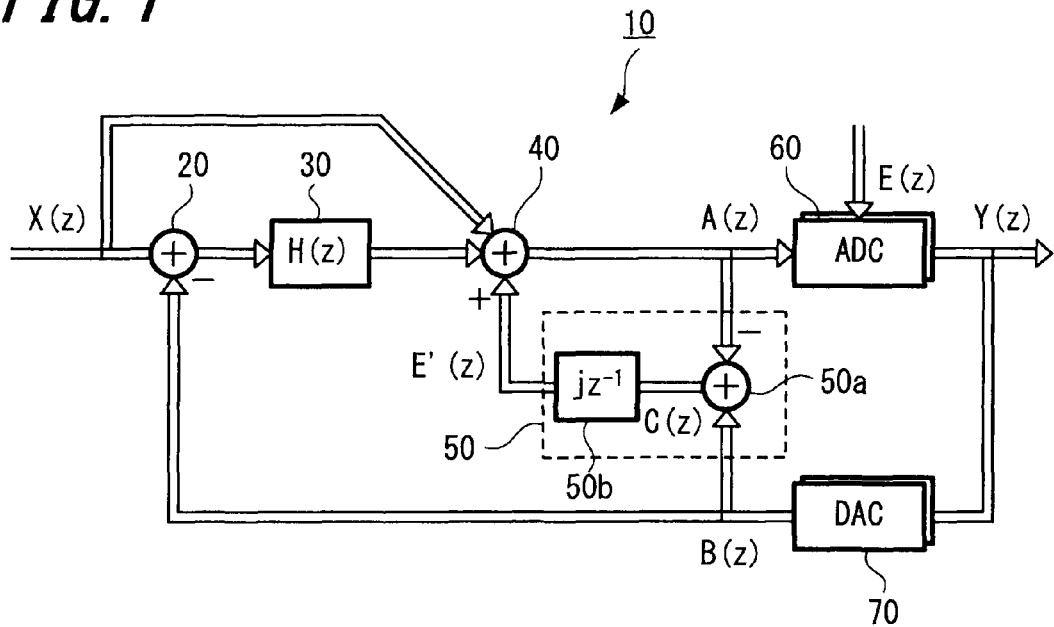
FIG. 1 is a block diagram illustrating a signal flow of a complex bandpass $\Delta\Sigma$AD modulator according to an embodiment of the present invention.
Figure 2:
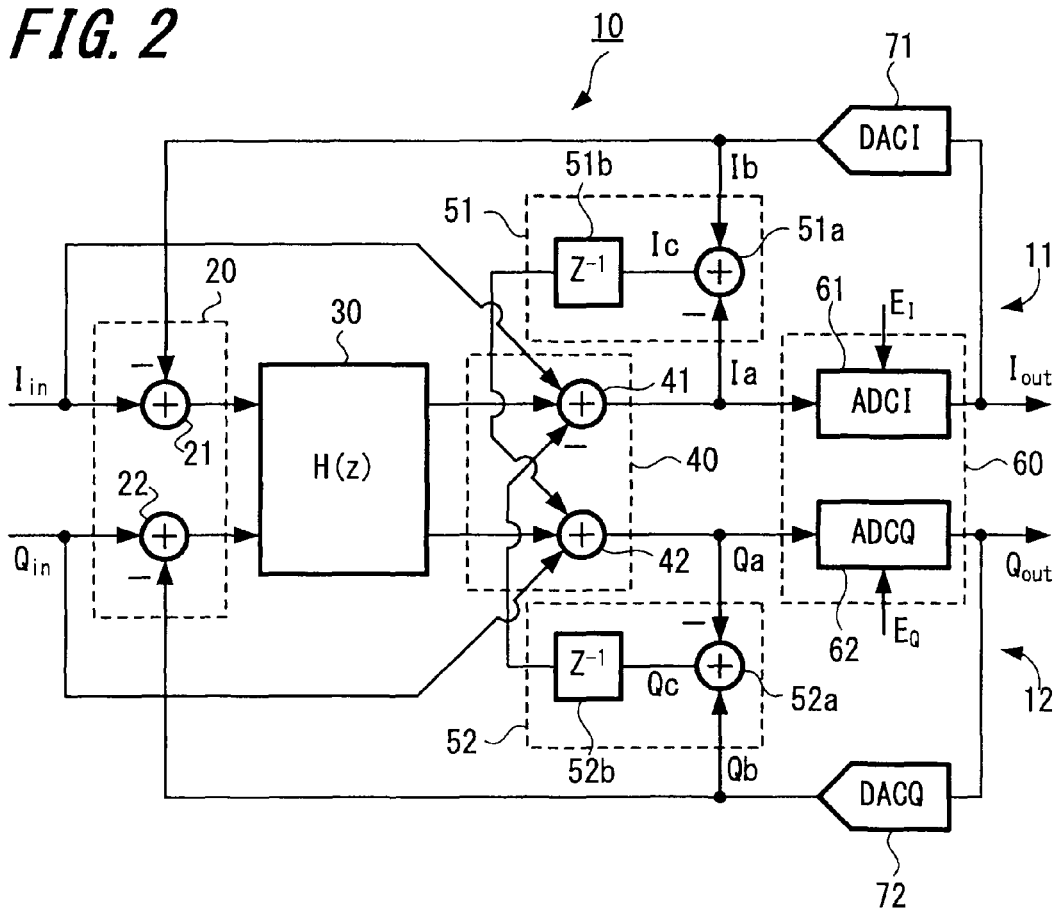
FIG. 2 is a schematic block circuit diagram of a complex bandpass $\Delta\Sigma$AD modulator according to an embodiment of the present invention.
Figure 3:
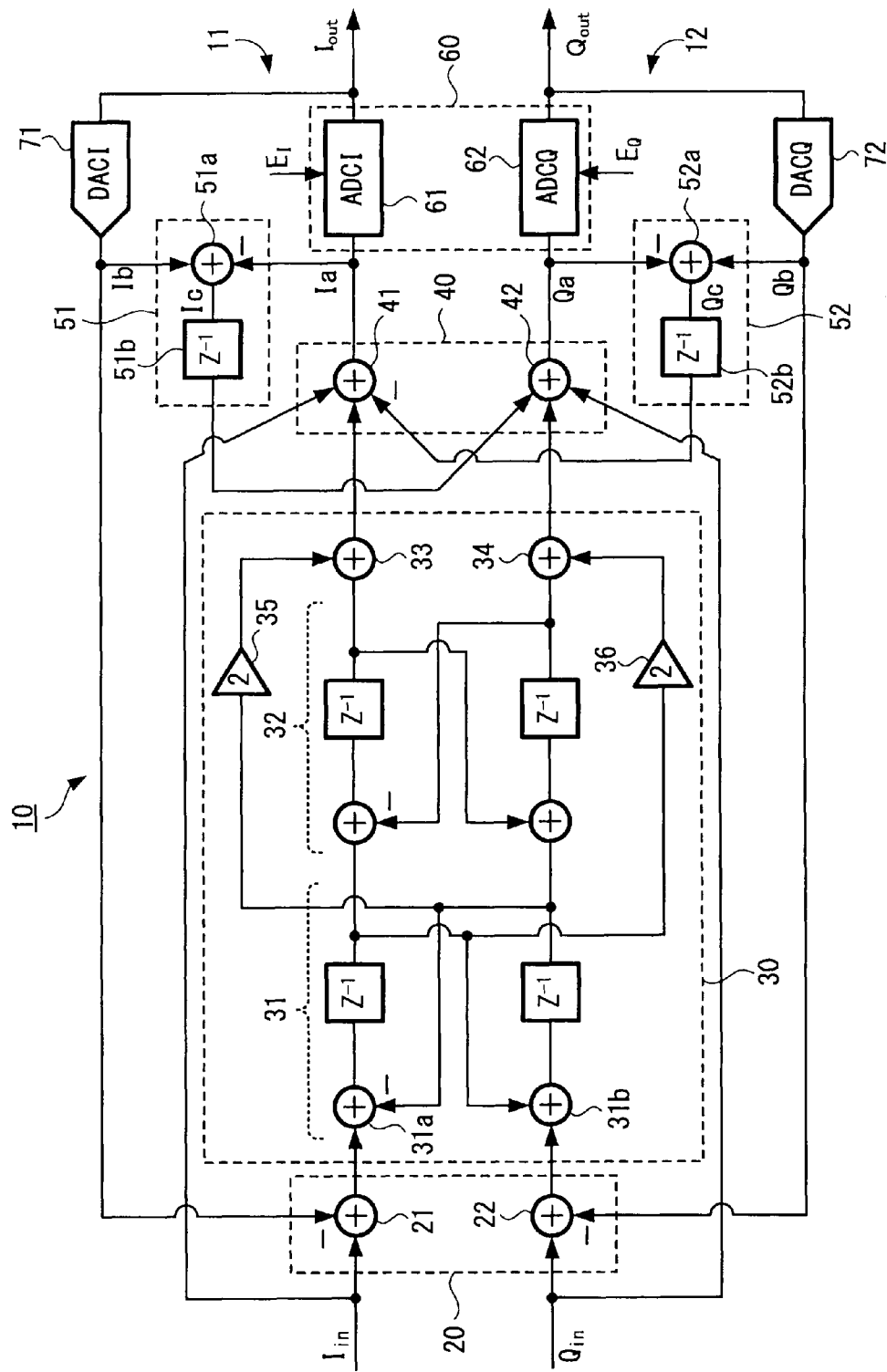
FIG. 3 is a schematic block circuit diagram showing an example of a complex bandpass $\Delta\Sigma$AD modulator according to an embodiment of the present invention.

First, a configuration of an embodiment of a complex bandpass ΔΣAD modulator of the present invention is explained with reference to FIGS. 1 to 3. FIG. 1 is a diagram showing a schematic configuration and signal flow of a complex bandpass ΔΣAD modulator in the present embodiment. FIG. 2 is a diagram showing a circuit block configuration of the complex bandpass ΔΣAD modulator in the present embodiment. FIG. 3 is a diagram showing a specific circuit configuration of the complex bandpass ΔΣAD modulator in the present embodiment. FIG. 3 shows an example of a diagram in which a complex bandpass filter 30 is configured by integrator circuits in two stages. In FIGS. 1 to 3, the same reference numerals are used to designate corresponding members.

In the present embodiment, a case where a signal band is in the vicinity of $F_{in}/F_s=0.25$ in the range of the normalized frequency $F_{in}/F_s=0$ to 1 is explained. In this case, an image band is in the vicinity of $F_{in}/F_s=0.75$. A circuit in a complex bandpass ΔΣAD modulator 10 is configured to be separated into an I-channel 11 in which an in-phase component signal $I_{in}$ of an input signal $X(z)$ (input complex signal) is processed and a Q-channel 12 in which an orthogonal component signal $Q_{in}$ is processed as is conventionally arranged (see FIGS. 2 and 3).

As shown in FIG. 1, the complex bandpass ΔΣAD modulator 10 is configured mainly by a subtraction unit 20, the complex bandpass filter 30, an addition unit 40, a noise extraction circuit unit 50, an ADC unit 60 (analog-to-digital conversion unit), and a DAC unit 70 (digital-to-analog circuit unit). The connection relationship of each unit is described below.

The input terminal of the subtraction unit 20 is connected to the input terminal (not shown) of the input signal X(z) and the output terminal of the DAC unit 70. The output terminal of the subtraction unit 20 is connected to the input terminal of the complex bandpass filter 30. The input terminal of the addition unit 40 is connected to the input terminal of the subtraction unit 20, the output terminal of the complex bandpass filter 30, and the output terminal of the noise extraction circuit unit 50. The output terminal of the addition unit 40 is connected to the input terminal of the ADC unit 60. The noise extraction circuit unit 50 has two input terminals and one of them is connected to the output terminal of the DAC unit 70 and the other input terminal is connected to the input terminal of the ADC unit 60. The output terminal of the ADC unit 60 is connected to the output terminal (not shown) of the output signal Y(z) and the input terminal of the DAC unit 70.

Figure 17:
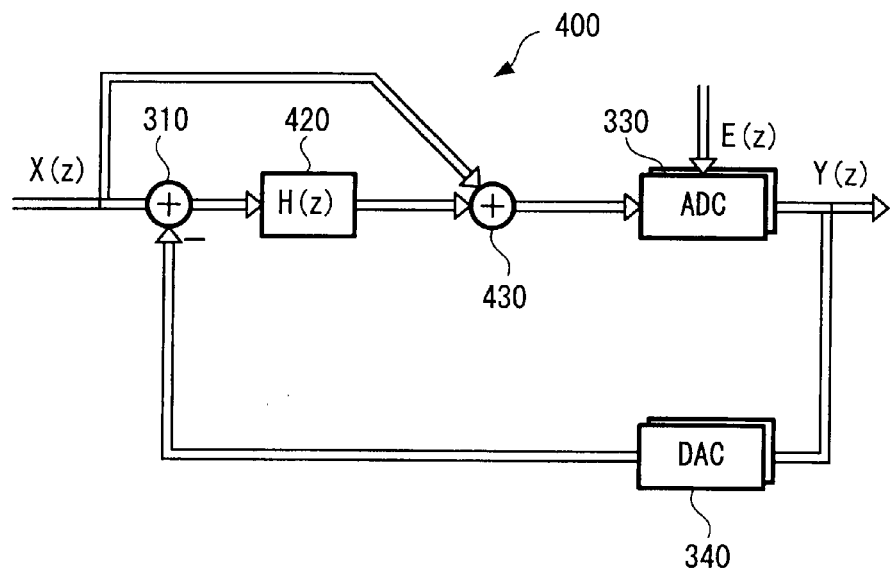
FIG. 17 is a block diagram illustrating a signal flow of a conventional feed-forward type complex bandpass ΔΣAD modulator.
Figure 18:
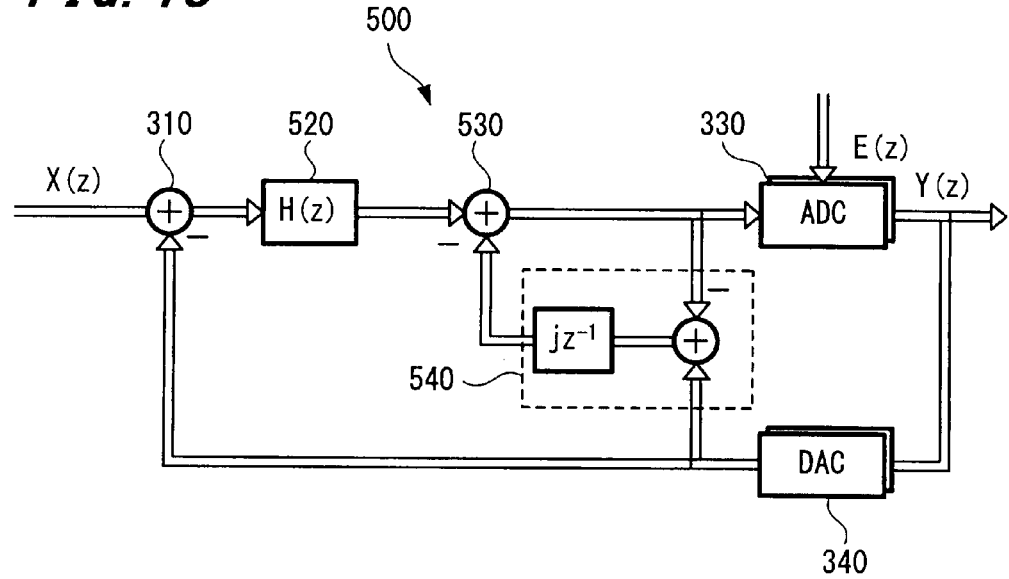
FIG. 18 is a block diagram illustrating a signal flow of a conventional noise-coupling type complex bandpass ΔΣAD modulator.
Figure 19:
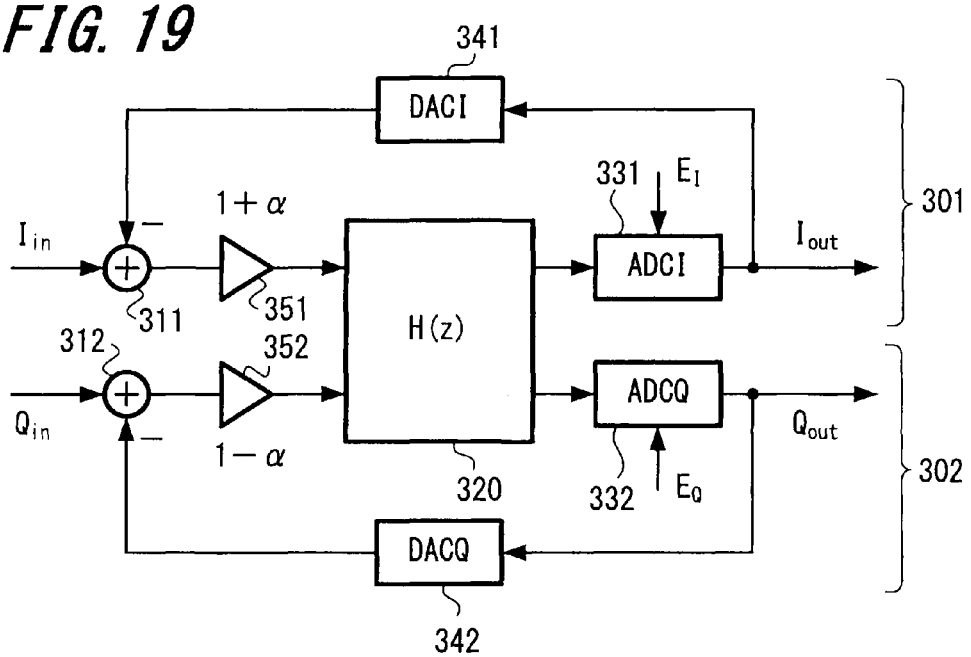
FIG. 19 is an equivalent block circuit diagram of a complex bandpass ΔΣAD modulator when there exists a mismatch between I- and Q-channels.
Figure 20:
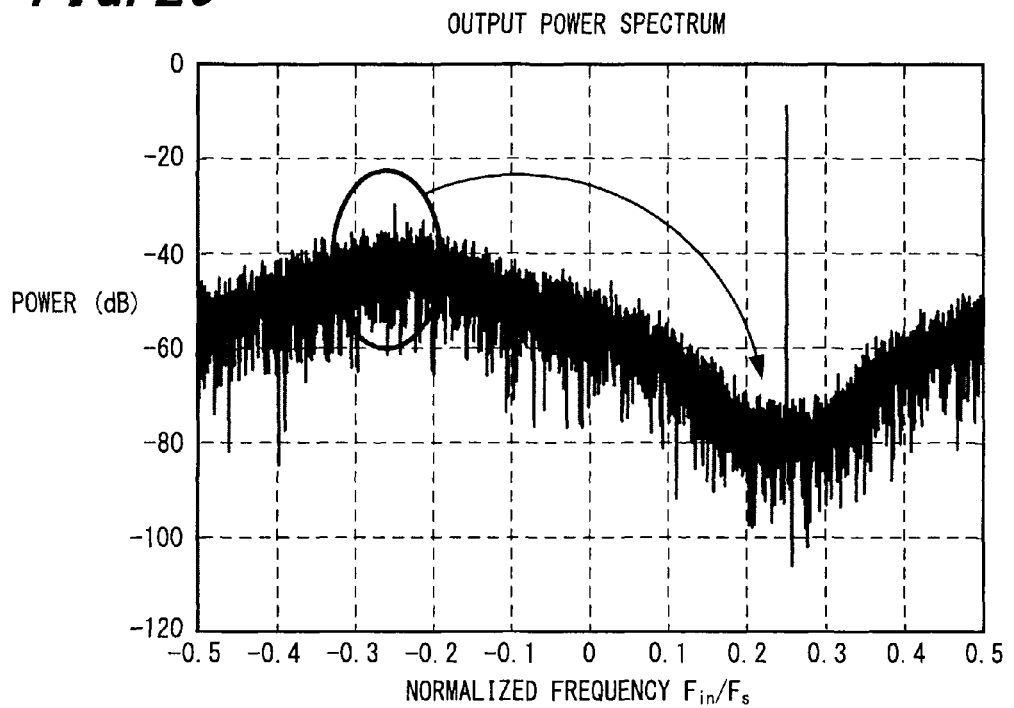
FIG. 20 shows an example of output power spectra of a complex bandpass ΔΣAD modulator when there exists a mismatch between I- and Q-channels.

As is obvious from a comparison between FIG. 1 and FIG. 17, the complex bandpass ΔΣAD modulator 10 in the present embodiment has a structure in which the noise extraction circuit unit 50 is further provided in a conventional feed-forward type complex bandpass ΔΣAD modulator 400. Then, the complex bandpass ΔΣAD modulator 10 in the present embodiment has a structure (error feedback structure) in which a quantized noise extracted by the noise extraction circuit unit 50 is fed back to the input side of the ADC unit 60. That is, the complex bandpass ΔΣAD modulator 10 in the present embodiment is a noise-coupling type modulator, a modulator that is an extended noise-coupling type time-interleave ΔΣAD modulator. The function and configuration of each unit of the complex bandpass ΔΣAD modulator 10 in the present embodiment are explained below in detail with reference to FIGS. 1 to 3.

As shown in FIG. 1, the subtraction unit 20 subtracts an output signal B(z) of the DAC unit 70 from a signal X(z) ($=I_{in}+jQ_{in}$) in a complex form input to the complex bandpass ΔΣAD modulator 10 from the outside. Further, as shown in FIG. 2, the subtraction unit 20 includes subtractors 21 and 22 provided in the I-channel and the Q-channel, respectively. The subtractor 21 of the I-channel 11 subtracts an output signal of a digital-to-analog converter 71 (DACI) of the I-channel 11, which is described below, from the in-phase component $I_{in}$ of the input signal X(z) and outputs the subtracted signal. On the other hand, the subtractor 22 of the Q-channel 12 subtracts an output signal of a digital-to-analog converter 72 (DACQ) of the Q-channel 12, which is described below, from the orthogonal component $Q_{in}$ of the input signal X(z) and outputs the subtracted signal.

The complex bandpass filter 30 includes an integrator circuit including an operational amplifier and is configured by connecting the one or more integrator circuits in one or more stages. At this time, the transfer function H(z) of the complex bandpass filter 30 is designed so that the quantized noise E(z) is attenuated in the signal band (in the vicinity of $F_{in}/F_s=0.25$), that is, the zero point of the noise transfer function NTF(z) of the complex bandpass ΔΣAD modulator 10 is generated in the signal band. More specifically, in the present embodiment, the complex bandpass filter 30 is configured such that the noise transfer function NTF(z) of the complex bandpass ΔΣAD modulator 10 when the noise extraction circuit unit 50 is not provided is represented by the following formula.

$$NTF(z) = \frac{1}{1+H(z)} = (1-jz^{-1})^N \quad \text{Formula 4}$$

N in Formula 4 described above is the number of stages of the integrator circuit (the order of the modulator in the signal band). In Formula 4 described above, the noise transfer function NTF(z) reaches zero when z=j, and the zero point when z=j corresponds to the normalized frequency $F_{in}/F_s$=0.25 (see Formula 1 described above).

Here, for example, an example in which the complex bandpass filter 30 is configured by the integrator circuits in two stages is explained briefly. In this case, as shown in FIG. 3, the complex bandpass filter 30 is configured mainly by an integrator circuit 31 in the first stage, an integrator circuit 32 in the second stage connected to the post stage thereof, addition blocks 33 and 34 provided in the I-channel 11 and the Q-channel 12 in the post stage of the integrator circuit 32, respectively and double integration blocks 35 and 36 provided in the I-channel 11 and the Q-channel 12, respectively.

Each integrator circuit is configured by an addition block and a delay block connected in series to the post stage of the addition block and has a structure in which an output signal of the delay block is fed back to the addition block. Such an integrator circuit is implemented using an operational amplifier (active circuit element). The double integration blocks 35 and 36 provided in the I-channel 11 and the Q-channel 12, respectively, are provided to design the characteristics of the second order modulator and the coefficients of these integration blocks are changed appropriately according to the design factors (order, zero point, etc.) of the modulator.

As shown in FIG. 1, the addition unit 40 adds the input signal X(z), an output signal of the complex bandpass filter 30, and an output signal of the noise extraction circuit unit 50 and outputs the added signal. Further, as shown in FIG. 2, the addition unit 40 includes adders 41 and 42 (first and second addition units) provided in the I-channel 11 and the Q-channel 12, respectively. The adder 41 of the I-channel 11 adds the in-phase component $I_{in}$ of the input signal X(z), an output signal of the I-channel 11 of the complex bandpass filter 30, and an inverted signal of an output signal of a noise extraction circuit 52 of the Q-channel 12, which is described below and outputs the added signal. On the other hand, the adder 42 of the Q-channel 12 adds the orthogonal component $Q_{in}$ of the input signal X(z), an output signal of the Q-channel 12 of the complex bandpass filter 30, and an output signal of a noise extraction circuit 51 of the I-channel 11, which is described below and outputs the added signal.

The noise extraction circuit unit 50 extracts the quantized noise E(z) (=$E_I$+j$E_Q$: C(z) in FIG. 1) of the ADC unit 60 based on an input signal A(z) of the ADC unit 60 and the output signal B(z) of the DAC unit 70, which are input to the noise extraction circuit unit 50. Specifically, because the input signal A(z) of the ADC unit 60 is equal to Y(z)−E(z) and the output signal B(z) of the DAC unit 70 is equal to Y(z), the noise extraction circuit unit 50 extracts the quantized noise E(z) (=C(z)) of the ADC unit 60 by subtracting the input signal A(z) of the ADC unit 60 from the output signal B(z) of the DAC unit (B(z)−A(z)). A subtraction block 50a in the noise extraction circuit unit 50 in FIG. 1 performed the extraction operation.

Further, the noise extraction circuit unit 50 delays the extracted quantized noise E(z) by one sample time ($T_s$) and phase-rotates the delayed signal by π/2. Then, the noise extraction circuit unit 50 outputs a quantized noise signal E'(z) delayed by one sample and phase-rotated to the addition unit 40. A $jz^{-1}$ block 50b within the noise extraction circuit unit 50 in FIG. 1 performs the operation of the delay and phase rotation. The more specific configuration and operation of the noise extraction circuit unit 50 are described below.

As shown in FIG. 2, the noise extraction circuit unit 50 includes noise extraction circuits 51 and 52 (first and second noise extraction circuits) provided in the I-channel 11 and the Q-channel 12, respectively. In terms of function, the noise extraction circuit 51 includes a subtraction block 51a and a delay block 51b and the noise extraction circuit 52 includes a subtraction block 52a and a delay block 52b.

The noise extraction circuit 51 of the I-channel 11 extracts the in-phase component $E_I$ (=Ic) of the quantized noise E(z) by subtracting an input signal Ia of an analog-to-digital converter 61 of the I-channel 11 from an output signal Ib of the digital-to-analog converter 71 of the I-channel 11, which is described below, using the subtraction block 51a (Ib−Ia). Subsequently, the noise extraction circuit 51 delays the extracted signal Ic by one sample time in the delay block 51b and outputs the delayed signal to the adder 42 of the Q-channel 12.

On the other hand, the noise extraction circuit 52 of the Q-channel 12 extracts the orthogonal component $E_Q$ (=Qc) of the quantized noise E(z) by subtracting an input signal Qa of an analog-to-digital converter 62 of the Q-channel 12 from an output signal Qb of the digital-to-analog converter 72 of the Q-channel 12, which is described below, using the subtraction block 52a (Qb−Qa). Subsequently, the noise extraction circuit 52 delays the extracted signal Qc by one sample time in the delay block 52b. Then, the noise extraction circuit 52 inverts the signal delayed in the delay block 52b and outputs it to the adder 41 of the I-channel 11.

That is, in the present embodiment, after the quantized noise signal extracted in the noise extraction circuit unit 50 is delayed by one sample time and when it is input to the addition unit 40, the in-phase component $E_I$ and the orthogonal component $E_Q$ of the quantized noise output from noise extraction circuits 51 and 52 of the I-channel 11 and the Q-channel 12 are input to the adders and 41 of the Q-channel 12 and the I-channel 11, respectively, in a crossing manner as shown in FIG. 2. Then, when the orthogonal component $E_Q$ of the quantized noise is input to the adder 41 of the I-channel 11, an inverted signal of the signal is input. In the present embodiment, the function of the component "j" of the $jz^{-1}$ block 50b in the noise extraction circuit unit 50 is implemented in this manner. Here, principles on which the function of the component "j" of the $jz^{-1}$ block 50b can be implemented with the above-described configuration are explained briefly.

In the noise extraction circuit unit 50, the extracted quantized noise E(z) is delayed by one sample and phase-rotated by 90 degrees by the $jz^{-1}$ block 50b as described above. Phase-rotating the quantized noise E(z) by 90 degrees is equivalent to multiplexing the quantized noise E(z) by an imaginary number "j", and therefore, the output signal E'(z) of the noise extraction circuit unit 50 is equal to j ($E_I$+j$E_Q$)=−$E_Q$+j$E_I$. In this case, the in-phase component of the output signal E'(z) of the noise extraction circuit unit 50 is −$E_Q$ and the orthogonal component is $E_I$. Thus, when inputting the output signals of the noise extraction circuits 51 and 52 of the I-channel 11 and the Q-channel 12, respectively, to the adders of the other channels in a crossing manner, the orthogonal component $E_Q$ of the quantized noise output from the noise extraction circuit 52 of the Q-channel 12 is inverted and thus inverted component is input to the adder 41 of the I-channel 11 as described above.

In the present embodiment, by configuring the noise extraction circuit unit as described above, it is possible to generate the zero point not only in the signal band but also in the image band in the noise transfer function NTF(z). Related principles are described below in detail. The technique to re-inject the quantized noise extracted by the noise extraction circuit unit 50 into the ADC unit 60 described above resembles the cascade (or MASH: Multistage Noise Shaping) scheme which gives a high-order noise shape using a low-order loop filter.

As shown in FIG. 1, the ADC unit 60 (internal ADC) quantizes the input analog signal A(z) and convert it into the digital signal (Y(z)) and outputs the converted signal. At this time, the ADC unit 60 outputs the output signal Y(z) to a processing circuit arranged in the post stage of the complex bandpass ΔΣAD modulator 10 and at the same time, outputs it also to the DAC unit 70.

Further, as shown in FIG. 2, the ADC unit 60 includes the analog-to-digital converters (quantizers) 61 and 62 (hereinafter, referred to as the ADCI 61 and the ADCQ 62, respectively) provided in the I-channel 11 and the Q-channel 12, respectively. The ADCI 61 (first analog-to-digital conversion unit) converts the input analog signal Ia into the digital signal $I_{out}$ and outputs it. On the other hand, the ADCQ 62 (second analog-to-digital conversion unit) converts the input analog signal Qa into the digital signal $Q_{out}$ and outputs it.

Both the ADCI 61 and the ADCQ 62 can be configured by, for example, a multibit quantizer (multibit AD converter). In this case, the following effect is obtained. When the ADC unit 60 is configured by a multibit quantizer, it is possible to assume that the quantized noise is a busy noise (white noise), and therefore, the quantized noise to be re-injected into the ADC unit 60 acts as a dither signal that reduces the tone or harmonic distortion component that appears in the output spectra of the ADC unit 60. Consequently, by using a multibit quantizer as the ADCI 61 and the ADCQ 62, the stability of the whole of the modulator is maintained even if the two quantized noises before and after feedback are coupled in the ADC unit 60.

As shown in FIG. 1, the DAC unit 70 (internal DAC) converts the input digital signal (Y(z)) into the analog signal B(z) and feeds back the analog signal B(z) to the subtraction unit 20 and the noise extraction circuit unit 50.

Further, as shown in FIG. 2, the DAC unit 70 includes the digital-to-analog converters 71 and 72 (hereinafter, referred to as the DACI 71 and the DACQ 72, respectively) provided in the I-channel 11 and the Q-channel 12, respectively. The DACI 71 (first digital-to-analog conversion unit) converts the input digital signal $I_{out}$ into the analog signal Ib and outputs it. On the other hand, the DACQ 72 (second digital-to-analog conversion unit) converts the input digital signal $Q_{out}$ into the digital signal Qb and outputs it.

Both the DACI 71 and the DACQ 72 can be configured by, for example, a multibit DA converter. By using a multibit DA converter as the DACI 71 and the DACQ 72, the stability of the whole of the modulator is maintained. However, because a multibit DA converter has nonlinearity, there may be a case where SQNDR of the modulator is reduced. In this case, it is recommended to provide a complex DWA (Data Weighted Averaging) algorithm processing circuit in the DAC unit 70 to reduce a deterioration in performance due to the nonlinearity of the multibit DA converter.

[Implementation Circuit of Complex Bandpass ΔΣAD Modulator]

Figure 4:
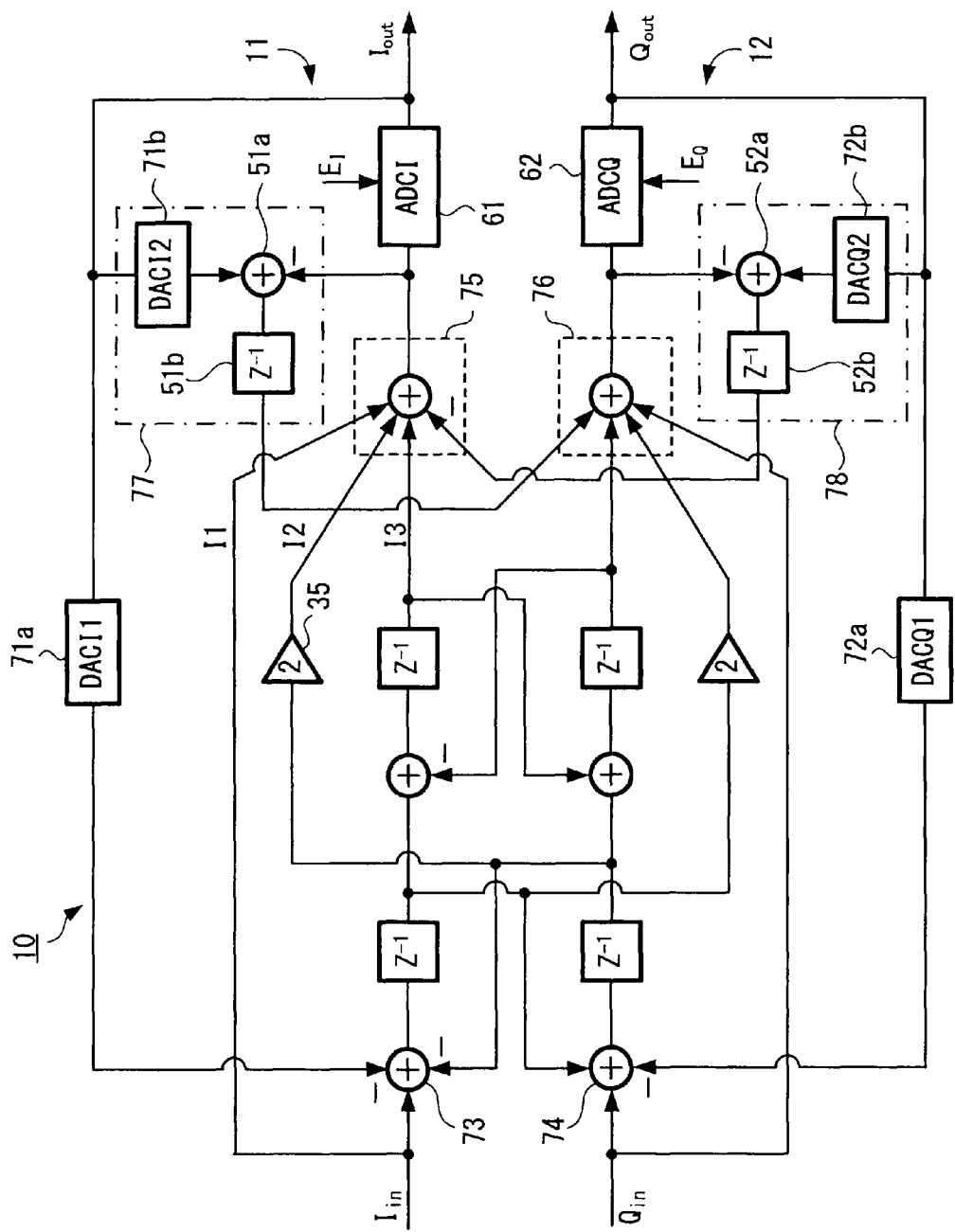
FIG. 4 is a block circuit diagram showing an example of an implementation circuit of a complex bandpass $\Delta\Sigma$AD modulator according to an embodiment of the present invention.

Next, an example of an implementation circuit of the complex bandpass ΔΣAD modulator 10 in the present embodiment is explained. FIG. 4 is a block diagram illustrating a schematic construction of an implementation circuit of the complex bandpass ΔΣAD modulator 10. FIG. 4 shows an example configuration of an implementation circuit of the complex bandpass ΔΣAD modulator 10 shown in FIG. 3.

When implementing the complex bandpass ΔΣAD modulator 10 shown in FIG. 3 in an actual circuit, the addition blocks 33 and 34 located closest to the output side in the complex bandpass filter 30 in FIG. 3 are integrated into one with the adders 41 and 42 of the addition unit 40, respectively. Circuit blocks 75 and 76 (hereinafter, referred to as noise addition blocks 75 and 76, respectively) enclosed by a broken line in FIG. 4 are circuit units corresponding thereto.

Further, when implementing the complex bandpass ΔΣAD modulator 10 shown in FIG. 3 in an actual circuit, addition blocks 31a and 31b located closest to the input side in the complex bandpass filter 30 in FIG. 3 are integrated into one with the subtractors 21 and 22 of the subtraction unit 20, respectively. Subtraction blocks 73 and 74 in FIG. 4 are circuit units corresponding thereto.

Furthermore, when implementing the complex bandpass ΔΣAD modulator 10 shown in FIG. 3 in an actual circuit, the digital-to-analog conversion unit (DAC unit) is configured to have two separate DAC units. One of the DAC units DA-converts an output signal of the complex bandpass ΔΣAD modulator 10, which is fed back to the subtraction unit 20, and the other DAC unit DA-converts an output signal of the complex bandpass ΔΣAD modulator 10, which is fed back to the noise extraction circuit unit 50.

Specifically, as shown in FIG. 4, the DACI 71 of the I-channel 11 is configured by a first DACI 71a (DACI 1) connected to the subtraction block 73 of the I-channel and a second DACI 71b (DACI 2) connected to the subtraction block 51a in the noise extraction circuit 51 of the I-channel 11. On the other hand, the DACQ 72 of the Q-channel 12 is configured by a first DACQ 72a (DACQ 1) connected to the subtraction block 74 of the Q-channel 12 and a second DACQ 72b (DACQ 2) connected to the subtraction block 52a in the noise extraction circuit 52 of the Q-channel 12.

Hereinafter, a circuit block 77 including the second DACI 71b of the I-channel 11 and the subtraction block 51a and the delay block 51b in the noise extraction circuit 51 in FIG. 4 (circuit block enclosed by an alternate long and short dash line in FIG. 4) is referred to as a noise extraction block 77 of the I-channel 11. Further, a circuit block 78 including the second DACQ 72b of the Q-channel 12 and the subtraction block 52a and the delay block 52b in the noise extraction circuit 52 (circuit block enclosed by a dotted line in FIG. 4) is referred to as a noise extraction block 78 of the Q-channel 12.

Figure 5:
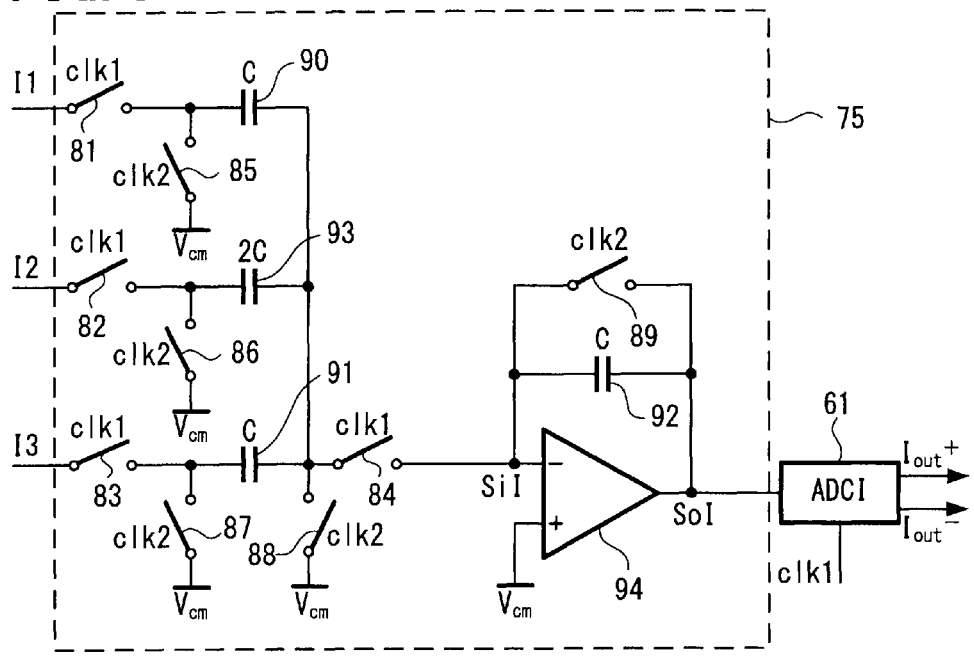
FIG. 5 is a circuit configuration diagram showing an example of an implementation circuit of a noise addition block of an I-channel.
Figure 6:
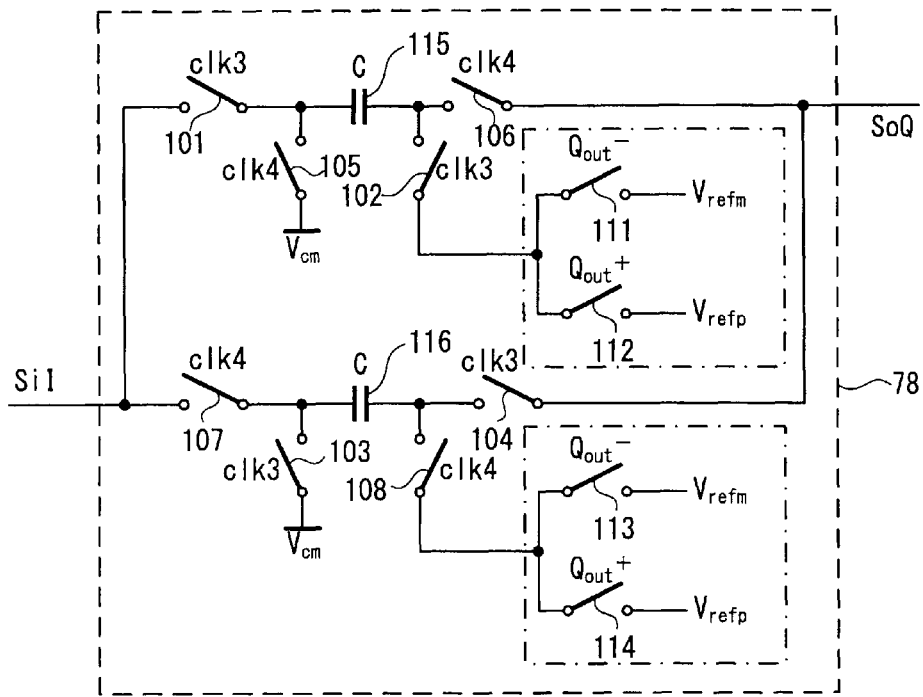
FIG. 6 is a circuit configuration diagram showing an example of an implementation circuit of a noise extraction block of a Q-channel.

FIGS. 5 and 6 each shows an example of an implementation circuit of the noise addition block 75 of the I-channel 11 and that of the noise extraction block 78 of the Q-channel 12, respectively. Further, the implementation circuit of the noise addition block 76 of the Q-channel 12 may be configured in the same manner as the noise addition block 75 of the I-channel 11 and the implementation circuit of the noise extraction block 77 of the I-channel 11 may be configured in the same manner as the noise extraction block 78 of the Q-channel 12. Incidentally, the implementation circuits of the noise addition block and the noise extraction block are not limited to the configuration examples shown in FIGS. 5 and 6, and other circuit configurations, which are designed appropriately by taking their uses, circuit scales into consideration, can be accepted. Further, the implementation circuits of the circuit blocks other than the noise addition block and the noise extraction block may be configured in the same manner as a conventional complex bandpass ΔΣAD modulator using a feed forward architecture.

As shown in FIG. 5, the noise addition block 75 is configured by four switches 81 to 84 the open/close operation of which is controlled by a first clock signal clk1, five switches 85 to 89 the open/close operation of which is controlled by a second clock signal clk2, three capacitors 90 to 92 having a capacitance of C, a capacitor having a capacitance of 2C, and a differential operational amplifier 94. Then, these circuit elements are connected appropriately in such a manner as shown in FIG. 5 so that each circuit element plays a role of a predetermined function.

Figure 7:
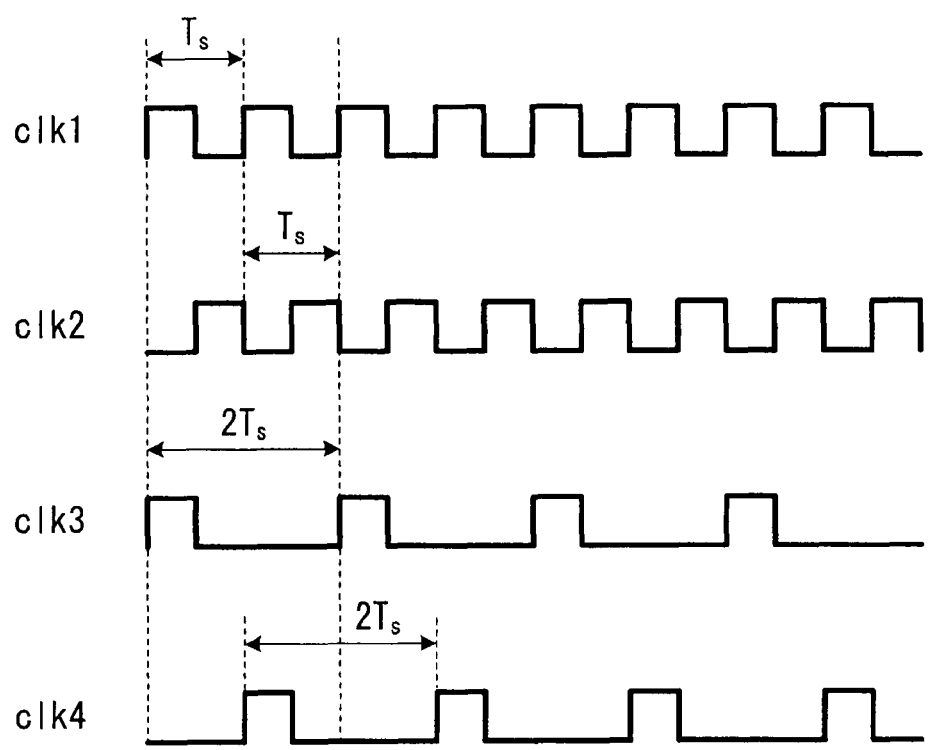
FIG. 7 is a waveform diagram of clock signals used in the implementation circuit in FIGS. 5 and 6.

The first clock signal clk1 and the second clock signal clk2 that control the operation timing of each switch in the noise addition block 75 are a clock signal having a sampling period Ts. Then, the phase difference between the first clock signal clk1 and the second clock signal clk2 is 180 degrees. FIG. 7 shows signal waveforms of the first clock signal clk1 and the second clock signal clk2. As shown in FIG. 5, the drive of the ADCI 61 is controlled by the first clock signal clk1.

Signals I1, I2 and I3 input to the noise addition block 75 are the in-phase component $I_{in}$ of the input signal, the output signal of the integration block 35 of the I-channel 11 in the complex bandpass filter 30, and the output signal of the I-channel 11 of the integrator circuit 32 in the second stage in the complex bandpass filter 30, respectively (see FIG. 4). $V_{cm}$ in FIG. 5 is a reference voltage. In the example in FIG. 5, from the ADCI 61, two signals $I_{out}^+$ and $I_{out}^-$ are output and this is because all the circuits in the complex bandpass ΔΣAD modulator 10 operate in a differential circuit. The phase difference between the output signals $I_{out}^+$ and $I_{out}^-$ of the ADCI 61 is 180 degrees (inverted).

As shown in FIG. 6, the noise extraction block includes four switches 101 to 104 the open/close operation of which is controlled by a third clock signal clk3 and four switches 105 to 108 the open/close operation of which is controlled by a fourth clock signal clk4. Further, the noise extraction block 78 includes two switches 111, 113 the open/close operation of which is controlled by an output signal $Q_{out}^+$ of the ADCQ 62 of the Q-channel 12, two switches 112, 114 the open/close operation of which is controlled by an output signal $Q_{out}^-$ of the ADCQ 62, and two capacitors 115, 116 having a capacitance of C. Then, these circuit elements are connected appropriately in such a manner as shown in FIG. 6 so that each circuit element plays a role of a predetermined function. A circuit unit in the region enclosed by an alternate long and short dash line in FIG. 6 performs a DA conversion, that is, the circuit unit that plays a role of the function of the second DACQ 72b.

The third clock signal clk3 and the fourth clock signal clk4 that control the operation timing of each switch in the noise extraction block 78 are a clock signal having sampling period $2T_s$. Then, the phase difference between the third clock signal clk3 and the fourth clock signal clk4 is 180 degrees. FIG. 7 shows signal waveforms of the third clock signal clk3 and the fourth clock signal clk4. The phase difference between the output signals $Q_{out}^+$ and $Q_{out}^-$ of the ADCQ 62 is 180 degrees.

A signal SoQ input to the noise extraction block 78 is an input signal of the ADCQ 62 of the Q-channel 12 and a signal SiI output from the noise extraction block 78 is input to a "−"

terminal of the differential operational amplifier 94 in FIG. 5. $V_{cm}$, $V_{refm}$, and $V_{refp}$ in FIG. 6 are reference voltages.

In the complex bandpass ΔΣAD modulator 10 in the present embodiment, the noise extraction circuit unit 50 may be implemented using a plurality of switches and a plurality of capacitors, which are passive circuit elements, as shown in FIG. 6.

[Principles of Suppression of Image Component]

Next, principles on which an image component can be suppressed even if there exists a mismatch between the I- and Q-channels in the complex bandpass ΔΣAD modulator 10 in the present embodiment are explained.

In the complex bandpass ΔΣAD modulator 10 shown FIG. 1, the relationship among the input signal X(z) ($=I_{in}+jQ_{in}$), the output signal Y(z) ($=I_{out}+jQ_{out}$), and the quantized noise signal E(z) ($E_I+jE_Q$) of the ADC unit 60 is expressed by the following formula.

$$Y(z) = X(z) + \frac{1}{1+H(z)} \cdot (1+jz^{-1}) \cdot E(z) \qquad \text{Formula 5}$$
$$= X(z) + NTF(z)(1+jz^{-1}) \cdot E(z)$$

NTF(z) in Formula 5 described above is the noise transfer function of the complex bandpass ΔΣAD modulator 10 when the noise extraction circuit unit 50 is not provided. If it is assumed that the complex bandpass filter 30 is configured by integrator circuits in N stages (N≧1) and is configured such that the zero point of the noise transfer function NTF(z) is generated in the signal band (z=j), NTF(z) is represented by the following formula.

$$NTF(z)=(1-jz^{-1})^N \qquad \text{Formula 6}$$

Thus, the noise transfer function NTF'(z) of the whole of the complex bandpass ΔΣAD modulator 10 in the present embodiment is represented by the following formula.

$$NTF'(z)=(1-jz^{-1})^N(1+jz^{-1}) \qquad \text{Formula 7}$$

From Formula 7 described above, it is known that the complex bandpass ΔΣAD modulator 10 in the present embodiment functions substantially as a (N+1)th order modulator by providing the noise extraction circuit unit 50. Further, in the present embodiment. from Formula 7 described above, it is known that the noise transfer function NTF'(z) reaches zero not only at z=j but also at z=−j. That is, with the configuration of the complex bandpass ΔΣAD modulator 10 shown in FIG. 1, zero point is generated at z=±j for the quantized noise signal E(z), which is shown in FIG. 8.

Figure 8:
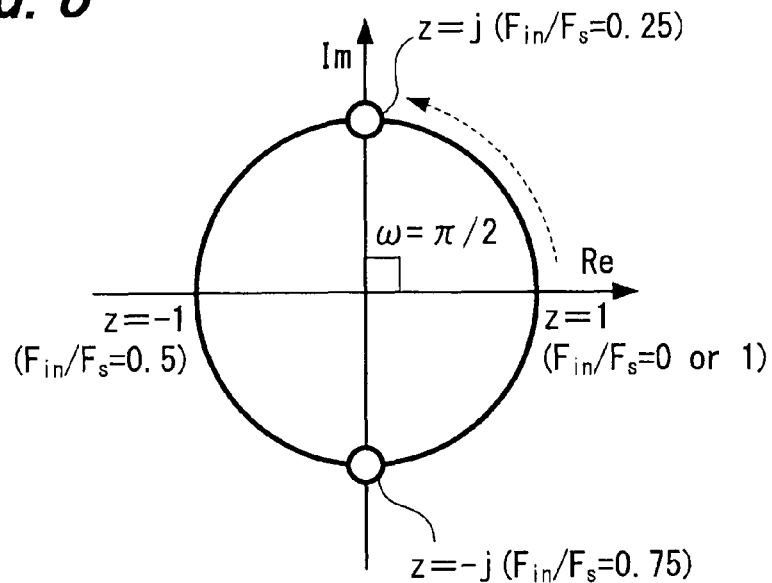
FIG. 8 is a diagram for explaining principles on which the problem of the mismatch between the I- and Q-channels can be solved by a complex bandpass $\Delta\Sigma$AD modulator of the present invention.

FIG. 8 shows a locus of a variable z ($=\exp\{j2\pi(F_{in}/F_s)\}$) when the normalized frequency $F_{in}/F_s$ varies. The locus of the variable z describes a circle having a radius of 1 (thick solid line in FIG. 8). The positions of circular marks in FIG. 8 represent zero points in the noise transfer function NTF'(z) that is represented by Formula 7. One cycle of locus of the variable z corresponds to the normalized frequency $F_{in}/F_s=0$ to 1 and the points at z=1, j, −1, and −j correspond to $F_{in}/F_s=0$ (or 1), 0.25, 0.5 and 0.75, respectively. That is, in the present embodiment, the noise transfer function NTF'(z) takes zero when $F_{in}/F_s=0.25$ and 0.75. Therefore, in the present embodiment, attenuation poles (notches) are generated, respectively, in the vicinity of $F_{in}/F_s=0.25$, which forms the signal band and in the vicinity of $F_{in}/F_s=0.75$, which forms the image band, in the spectral characteristics of the noise transfer function, which is shown in FIG. 9.

Figure 9:
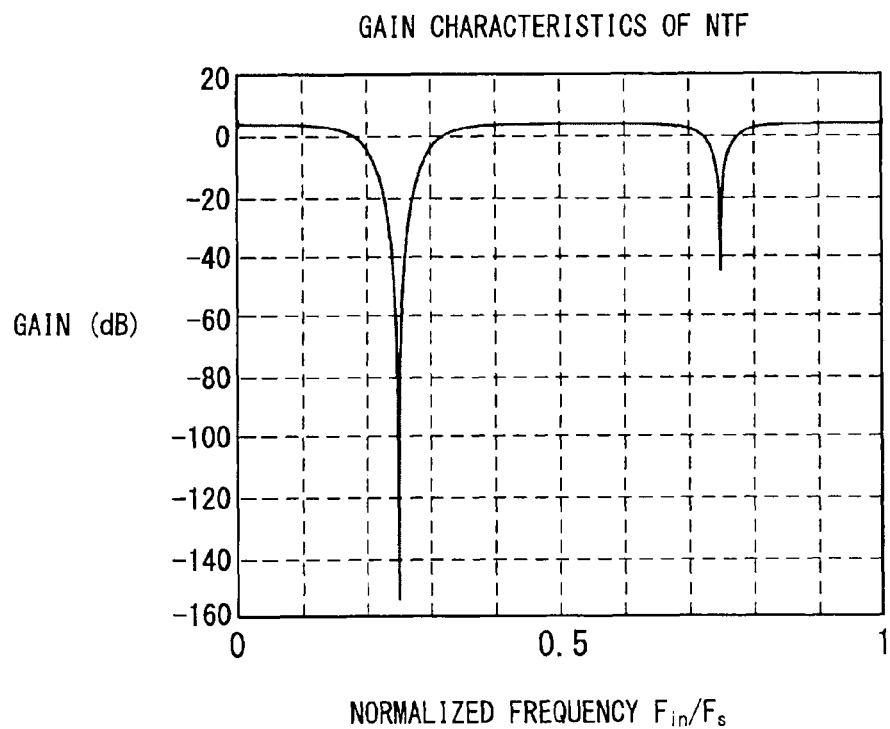
FIG. 9 is a schematic diagram of gain characteristics of a noise transfer function of a complex bandpass ΔΣAD modulator according to an embodiment of the present invention.
Figure 21:
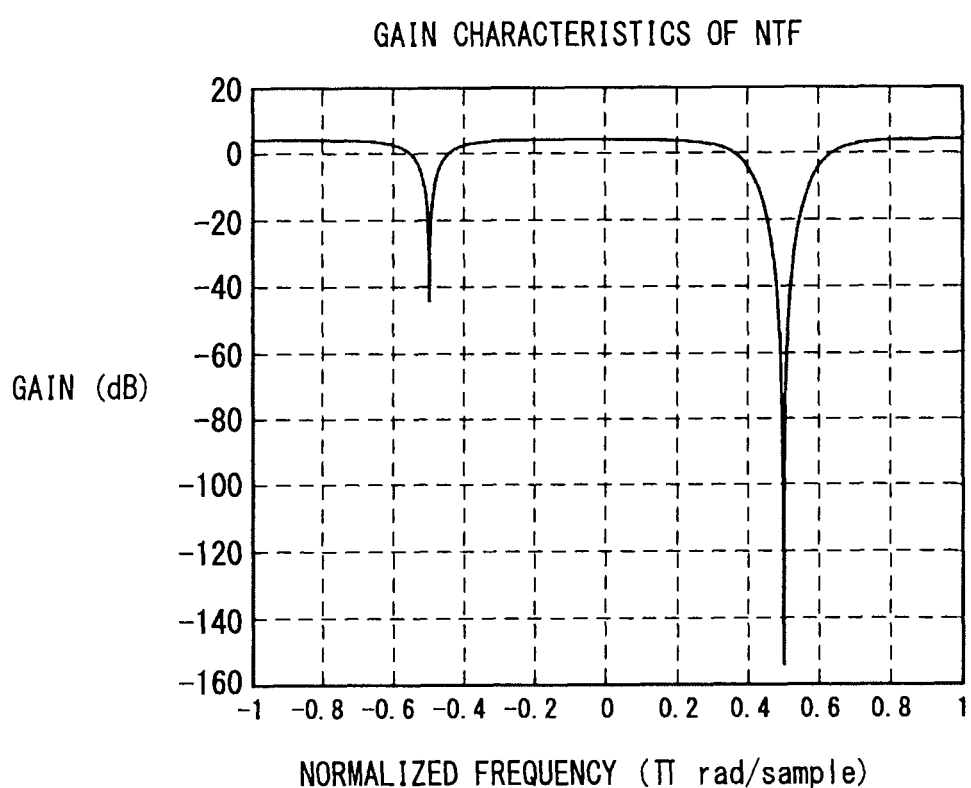
FIG. 21 shows an example of gain characteristics of a noise transfer function of a conventional complex bandpass ΔΣAD modulator.

FIG. 9 is a drawing showing the gain characteristics of the noise transfer function NTF'(z) of the complex bandpass ΔΣAD modulator 10 in the present embodiment, where the horizontal axis represents the normalized frequency $F_{in}/F_s$ and the vertical axis represents the gain. As shown in FIG. 9, in the present embodiment, by providing the noise extraction circuit unit 50, the attenuation poles are generated, respectively, in the vicinity of $F_{in}/F_s=0.25$, which forms the signal band, and in the vicinity of $F_{in}/F_s=0.75$, which forms the image band, and the same characteristics as the gain characteristics of the noise transfer function obtained in Non-Patent Document 4 (see FIG. 21) can be obtained. That is, in the present embodiment, it is possible to noise-shape the noise transfer function so that the quantized noise can be suppressed not only in the signal band but also in the image band by adopting a structure in which the quantized noise extracted in the noise extraction circuit unit 50 is re-injected into the ADC unit 60. Thus, in the present embodiment, it is possible to suppress the image component even if there exists a mismatch between the I- and Q-channels.

As explained above, in the complex bandpass ΔΣAD modulator 10 in the present embodiment, it is possible to generate the attenuation pole not only in the signal band but also in the image band in the spectral characteristics of the noise transfer function by providing the noise extraction circuit unit 50. With this arrangement, in the present embodiment, it is possible to suppress influence of the image component exerted on the signal component even if there exists a mismatch between the I- and Q-channels. As a result, the reduction in SQNDR in the signal band can be suppressed, and highly efficient and high-precision AD conversion is made.

Further, in the complex bandpass ΔΣAD modulator 10 in the present embodiment, it is possible to configure the noise extraction circuit unit 50 provided to generate the attenuation pole in the image band with capacitors and switches, which are passive circuit elements. That is, in the present embodiment, it is not necessary to use an integrator circuit including an operational amplifier to generate the attenuation pole in the image band unlike Non-Patent Document 4. Thus, in the present embodiment, the complex bandpass ΔΣAD modulator 10 is driven with simpler configuration and less power consumption than was previously possible.

[Simulation Evaluation]

The effectiveness of the complex bandpass ΔΣAD modulator 10 in the present embodiment described above was evaluated by carrying out a simulation analysis. Specifically, the output spectra of the complex bandpass ΔΣAD modulator 10 was simulated and calculated provided that the amount of mismatch between I- and Q-channels was 3%. The simulation analysis was carried out in the case where the complex bandpass filter 30 was configured by integrator circuits in two stages (configuration in FIG. 3). Further, for a comparison, the same simulation analysis was carried out on the complex bandpass ΔΣAD modulator not including the noise extraction circuit unit 50, that is, a conventional complex bandpass ΔΣAD modulator 400 with feed forward architecture (comparative example: see FIG. 17). It was assumed that the configuration of the complex bandpass ΔΣAD modulator 400 in the comparative example was the same as that in the present embodiment except that the noise extraction circuit unit 50 was not provided.

Figure 10:
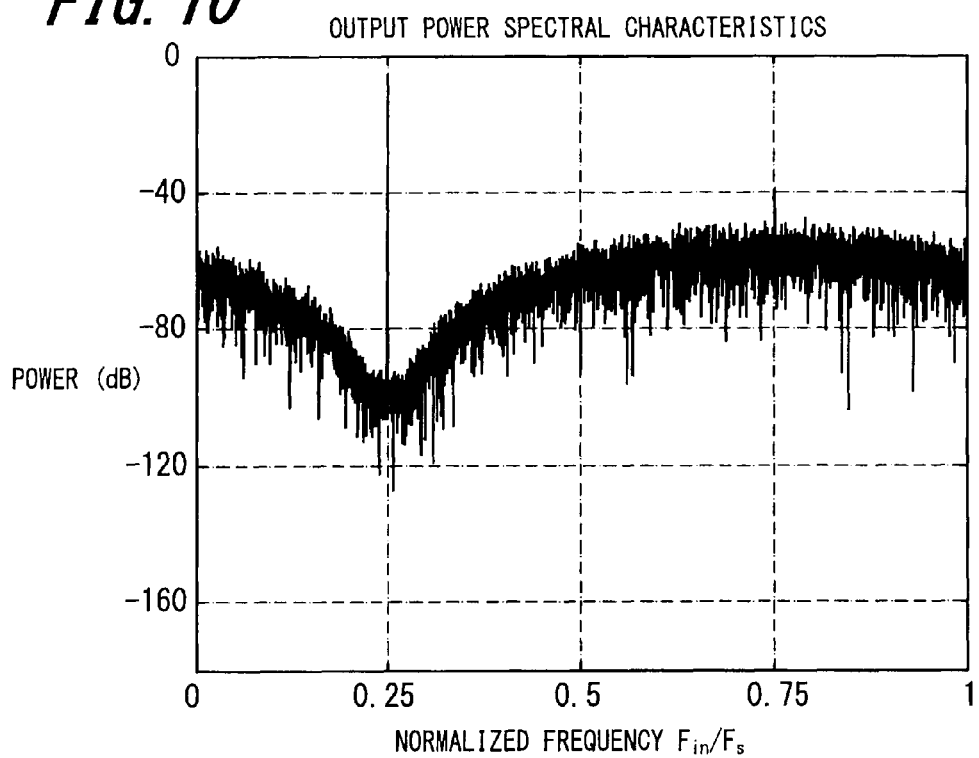
FIG. 10 shows output power spectral characteristics of a complex bandpass ΔΣAD modulator in a comparative example.
Figure 11:
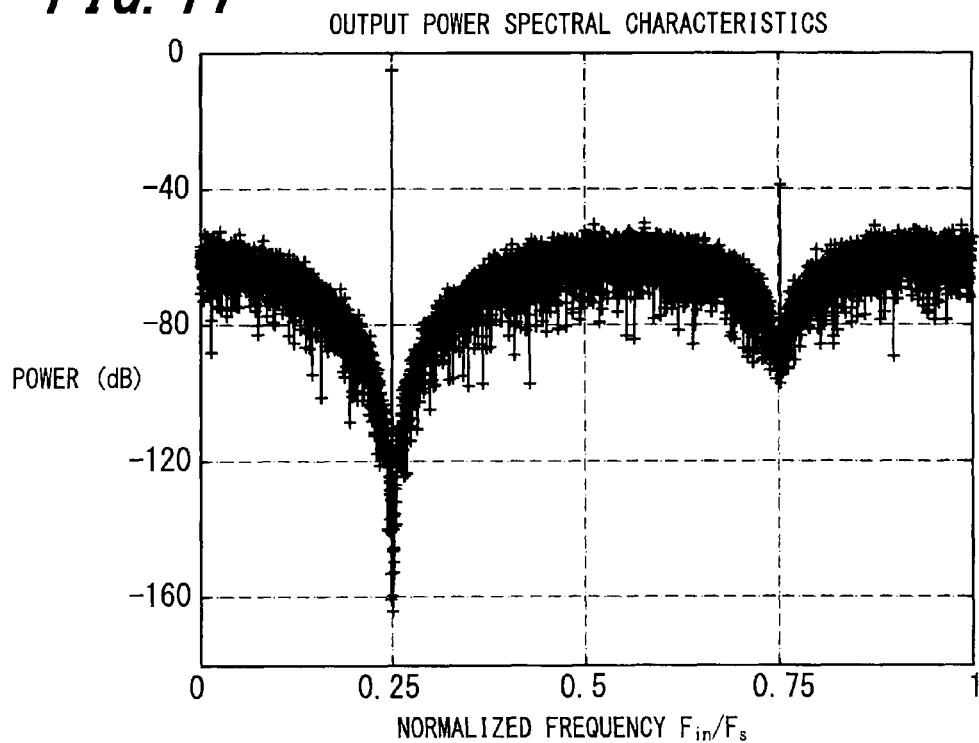
FIG. 11 shows output power spectral characteristics of a complex bandpass ΔΣAD modulator according to an embodiment of the present invention.

FIG. 10 and FIG. 11 show the results of the simulation analysis. FIG. 10 shows the output power spectra of the complex bandpass ΔΣAD modulator 400 in the comparative example and FIG. 11 shows the output power spectra of the complex bandpass ΔΣAD modulator 10 in the present embodiment. The horizontal axis in FIG. 10 and FIG. 11 represents the normalized frequency ($F_{in}/F_s$) and the vertical axis represents the level of the output power.

In the output power spectra of the complex bandpass ΔΣAD modulator 400 in the comparative example (FIG. 10), the noise level slightly increases in the image band (in the vicinity of $F_{in}/F_s=0.75$). As a result, the noise level is not attenuated sufficiently in the signal band (in the vicinity of $F_{in}/F_s=0.25$).

On the other hand, in the output power spectra of the complex bandpass ΔΣAD modulator 10 in the present embodiment (FIG. 11), the attenuation pole (notch) is formed in the image band (in the vicinity of $F_{in}/F_s=0.75$) and the noise level in the image band is suppressed sufficiently. As a result, the noise level in the signal band (in the vicinity of $F_{in}/F_s=0.25$) is attenuated sufficiently compared to the comparative example.

From the results shown in FIGS. 10 and 11, it is revealed that by providing the noise extraction circuit unit 50 to the complex bandpass ΔΣAD modulator 10 as in the present embodiment, the influence of the image component caused by a mismatch between the I- and Q-channels on the signal component is suppressed, and the deterioration in SQNDR in the signal band is prevented.

Figure 12:
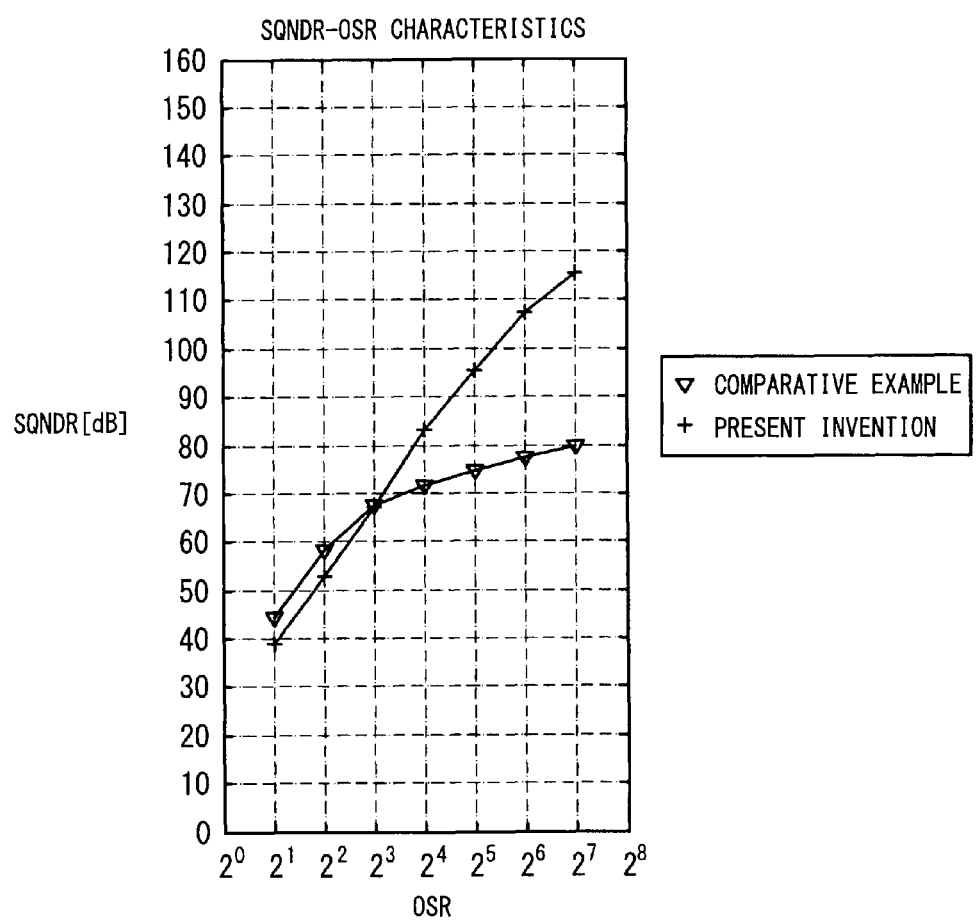
FIG. 12 shows SQNDR-OSR characteristics of complex bandpass ΔΣAD modulators in an embodiment of the present invention and in a comparative example.

In the present embodiment, the relationship between SQNDR in the signal band and the over-sampling ratio (OSR) was examined based on the output power spectra described above. Further, for a comparison, the relationship between SQNDR and OSR was also examined with regard to the complex bandpass ΔΣAD modulator 400 in the comparative example. FIG. 12 shows the evaluation results. The horizontal axis in FIG. 12 represents OSR and the vertical axis represents SQNDR. The characteristics denoted by the plus marks in FIG. 12 are the characteristics in the present embodiment and the characteristics denoted by the inverted white triangles are the characteristics in the comparative example.

As is obvious from FIG. 12, in the complex bandpass ΔΣAD modulator 400 in the comparative example, when OSR increases, SQNDR is saturated. On the other hand, in the complex bandpass ΔΣAD modulator 10 in the present embodiment, SQNDR is not saturated when OSR increases and SQDNR increases at a rate of about 15 dB/Oct. This indicates the characteristics of a second order ΔΣAD modulator. From the results shown in FIG. 12, it is also revealed that the influence of the image component caused by a mismatch between the I- and Q-channels on the signal component is suppressed sufficiently in the present embodiment.

In the present embodiment, by providing the noise extraction circuit unit 50 as described above, the order of the whole modulator increases from the second order to the third order, however, the frequency band in which the noise extraction circuit unit 50 operates mainly is the image band. That is, in the present embodiment, the substantial order of the modulator that acts on the signal band is the second order by the complex bandpass filter 30. Thus, the characteristics of the complex bandpass ΔΣAD modulator 10 in the present embodiment are equivalent to the characteristics of the second order modulator as shown in FIG. 12.

In the present embodiment described above, the explanation is made based on an example in which the signal band is in the vicinity of $F_{in}/F_s=0.25$ and the image band is in the vicinity of $F_{in}/F_s=0.75$ in the range of the normalized frequency $F_{in}/F_s=0$ to 1. However, the present invention is not limited to this example. The signal band may be located other than in the vicinity of $F_{in}/F_s=0.25$. In this case, it is preferred to design the configuration of the complex bandpass filter 30 and the noise extraction circuit unit 50 in the complex bandpass ΔΣAD modulator such that the zero point of the noise transfer function NTF'(z) of the complex bandpass ΔΣAD modulator is, for example, $z=c+jd$ (c and d are coefficients) for the signal component and $z=c-jd$ for the image component.

More specifically, it is recommended to design the transfer function H(z) of the complex bandpass filter 30 such that the zero point of the noise transfer function NTF'(z) is $z=c+jd$ for the signal component. On the other hand, it is recommended to configure the noise extraction circuit unit 50 so as to, for example, after delaying an extracted quantized noise by one sample, phase-rotate the delayed signal by a predetermined angle corresponding to the position of $z=c-jd$ in the z-space such that the zero point of the noise transfer function NTF'(z) is $z=c-jd$ for the image component.

[Example Applied to Digital Radio Receiver]

As described above, because the circuit configuration of the complex bandpass ΔΣAD modulator of the present invention is simple and an AD modulation is made with low power consumption and high precision, it can be applied to various digital radio receivers used in a radio communication system. An example thereof is shown in FIG. 13.

Figure 13:
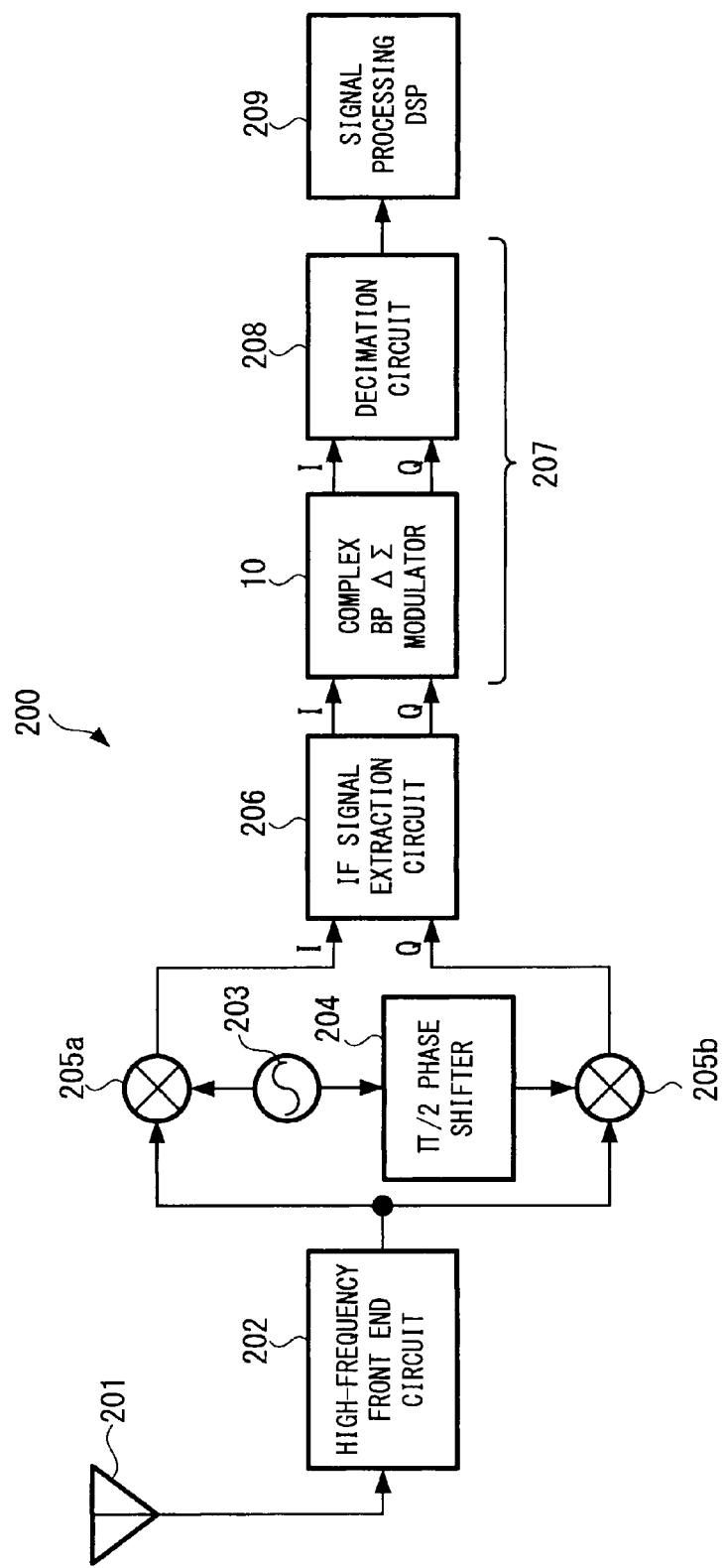
FIG. 13 is a schematic configuration diagram showing an example of a digital radio receiver according to an embodiment of the present invention.
Figure 14:
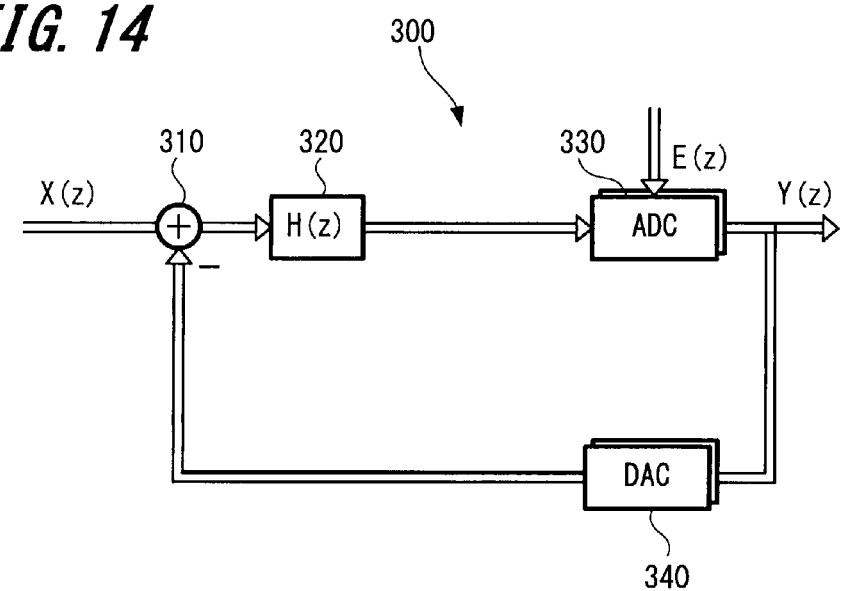
FIG. 14 is a block diagram illustrating a signal flow of a conventional complex bandpass ΔΣAD modulator.
Figure 15:
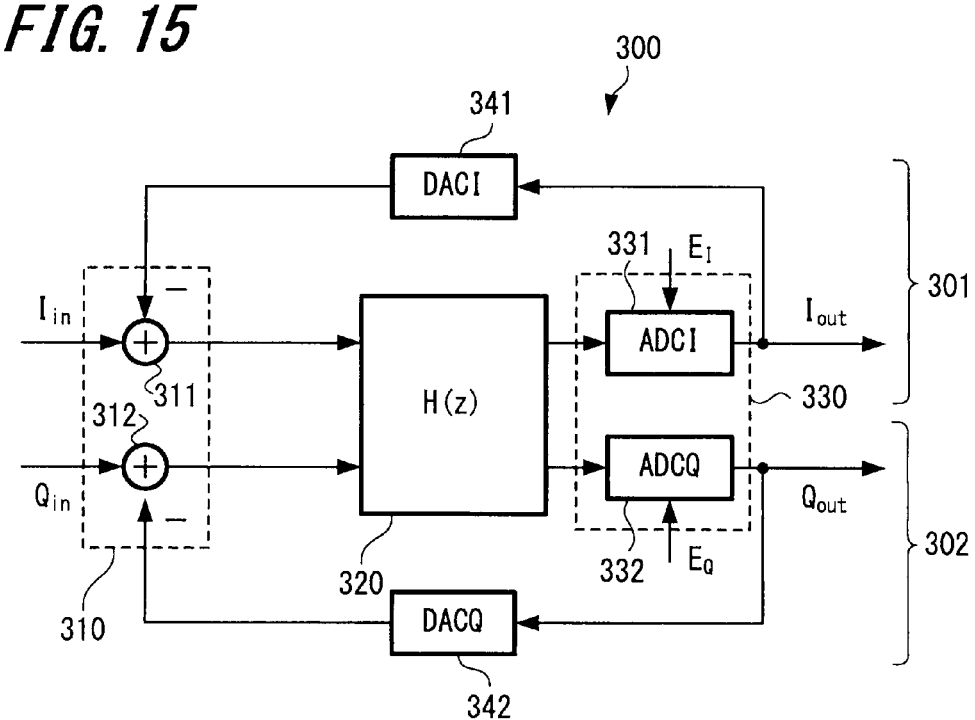
FIG. 15 is a schematic block circuit diagram of a conventional complex bandpass ΔΣAD modulator.
Figure 16:
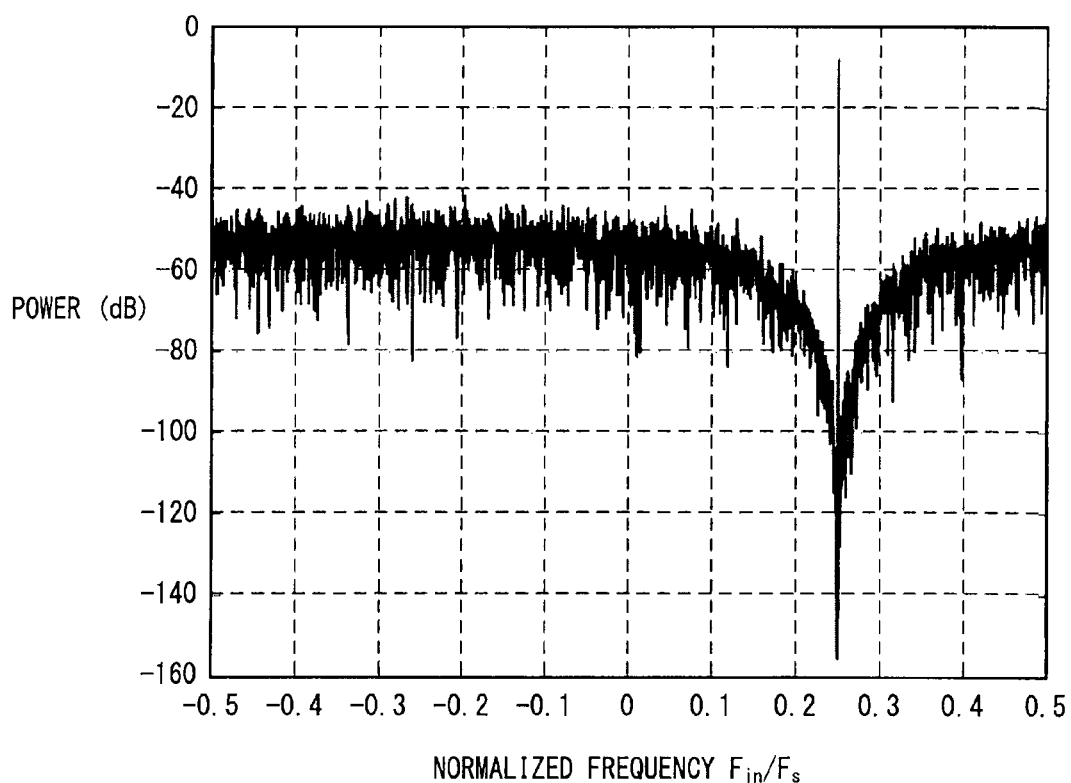
FIG. 16 shows an example of output power spectral characteristics of a conventional complex bandpass ΔΣAD modulator.

FIG. 13 is a drawing illustrating a block diagram of a digital radio receiver to which the complex bandpass ΔΣAD modulator of the present invention described above is applied. A digital radio receiver 200 is configured mainly by an antenna 201, a high-frequency front end circuit 202, a local oscillator 203, a π/2 phase shifter 204, two mixers 205a, 205b, an intermediate frequency signal extraction circuit 206, an AD conversion circuit 207, and a signal processing digital signal processor (DSP) 209. Then, the AD conversion circuit 207 is configured by the complex bandpass ΔΣAD modulator 10 of the present invention and a decimation circuit 208.

The input terminal of the high-frequency front end circuit 202 is connected to the antennal 201 and a radio signal received by the antenna 201 is input to the high-frequency front end circuit 202. The high-frequency front end circuit 202 performs low-noise high-frequency amplification on the input radio signal and outputs the processed analog signal to the two mixers 205a and 205b.

The local oscillator 203 is connected to the mixer 205a and the π/2 phase shifter 204. Then, the local oscillator 203 generates a local oscillation signal having a predetermined frequency and outputs the signal to the mixer 205a and the π/2 phase shifter 204. The π/2 phase shifter 204 phase-rotates the local oscillation signal input from the local oscillator 203 by π/2 and outputs the signal to the mixer 205b.

The input terminal of the mixer 205a is connected to the output terminal of the high-frequency front end circuit 202 and the output terminal of the local oscillator 203 and the mixer 205a mixes the analog output signal of the high-frequency front end circuit 202 and the local oscillation signal input from the local oscillator 203. The output terminal of the mixer 205a is connected to the input terminal of the I-channel of the intermediate frequency signal extraction circuit 206 and the mixer 205a outputs a mixed analog I signal (in-phase component of the input signal) to the I-channel of the intermediate frequency signal extraction circuit 206.

On the other hand, the input terminal of the mixer 205b is connected to the output terminal of the high-frequency front end circuit 202 and the output terminal of the π/2 phase shifter 204 and the mixer 205b mixes the analog output signal of the high-frequency front end circuit 202 and the analog output signal (local oscillation signal phase-rotated by π/2) of the π/2 phase shifter 204. Further, the output terminal of the mixer 205b is connected to the input terminal of the Q-channel of the intermediate frequency signal extraction circuit 206 and the mixer 205b outputs a mixed analog Q signal (orthogonal component of the input signal) to the Q-channel of the intermediate frequency signal extraction circuit 206.

The intermediate frequency signal extraction circuit 206 is mainly configured by a complex anti-alias filter (bandpass filter) and an intermediate frequency amplifier (not shown). The intermediate frequency signal extraction circuit 206 extracts the intermediate frequency components of the analog I signal and the analog Q signal input to the I- and Q-channels, respectively, from the mixers 205a and 205b and amplifies the extracted signals. Then, the intermediate frequency signal extraction circuit 206 outputs the analog I signal and the analog Q signal subjected to the above-mentioned processing in the I-channel and the Q-channel, respectively, to the input terminals of the I-channel and the Q-channel, respectively, of the complex bandpass ΔΣAD modulator 10.

The complex bandpass ΔΣAD modulator 10 converts the analog I signal and the analog Q signal input to the I-channel and the Q-channel, respectively, into a digital I signal and a digital Q signal. Then, the complex bandpass ΔΣAD modulator 10 outputs the converted digital I signal and the digital Q signal to the input terminals of the I-channel and the Q-channel, respectively, of the decimation circuit 208.

The decimation circuit 208 is configured by a digital filter circuit and performs a predetermined decimation process on the digital intermediate frequency signal input from the complex bandpass ΔΣAD modulator 10. Specifically, the decimation circuit 208 converts a low-bit high-rate digital signal having a bit rate of 20 Mbps in 3 bits, for example, into a high-bit low-rate digital signal having a bit rate of 1 kbps in 12 bits, for example. Then, the decimation circuit 208 outputs the digital signal subjected to the above-mentioned processing to the signal processing DSP 209.

The signal processing DSP 209 performs a predetermined process such as clock reproduction and demodulation, on the digital signal input from the decimation circuit 208. Thus, demodulated data of the received signal is obtained. As described above, because the digital radio receiver 200 in FIG. 13 includes the complex bandpass ΔΣAD modulator of the present invention, data is demodulated with low power consumption and high precision.

The receiver to which the complex bandpass ΔΣAD modulator of the present invention can be applied is not limited to the example shown in FIG. 13 and the complex bandpass ΔΣAD modulator can be applied to a receiver used in various radio communication systems and the same effects can be obtained.

EXPLANATION OF REFERENCE NUMERALS

10 complex bandpass ΔΣAD modulator
20 subtraction unit
21, 22 subtractor
30 complex bandpass filter
31, 32 integrator circuit
40 addition unit
41, 42 adders
50 noise extraction circuit unit
51, 52 noise extraction circuit
60 ADC unit
61, 62 analog-to-digital converter (quantizer)
70 DAC unit
71, 72 digital-to-analog converter
200 digital radio receiver
208 decimation circuit

The invention claimed is:

1. A complex bandpass ΔΣAD modulator, comprising:
an analog-to-digital conversion unit configured to convert an analog complex signal into a digital complex signal;
a digital-to-analog conversion unit configured to convert a complex signal output from the analog-to-digital conversion unit into an analog complex signal;
a subtraction unit configured to subtract a complex signal output from the digital-to-analog conversion unit from an input complex signal input from the outside;
a complex bandpass filter configured to allow a signal component in a predetermined frequency band out of a complex signal output from the subtraction unit to pass through;
a noise extraction circuit unit configured to extract a quantized noise signal of the analog-to-digital conversion unit based on a complex signal input to the analog-to-digital conversion unit and the complex signal output from the digital-to-analog conversion unit, delay the extracted quantized noise signal by one sample time, phase-rotate the delayed signal by a predetermined angle, and feed back the phase-rotated signal to an input side of the analog-to-digital conversion unit; and
an addition unit configured to add the input complex signal, a complex signal output from the complex bandpass filter, and the complex signal output from the noise extraction circuit unit and output the added signal to the analog-to-digital conversion unit.

2. The complex bandpass ΔΣAD modulator according to claim 1, wherein
a center frequency in the predetermined frequency band is a frequency of one-fourth of a sampling frequency and the predetermined angle of the phase rotation is $\pi/2$.

3. The complex bandpass ΔΣAD modulator according to claim 2, wherein
the addition unit includes a first addition unit to which an in-phase component signal of the complex signal output from the complex bandpass filter is input and a second addition unit to which an orthogonal component signal of the complex signal output from the complex bandpass filter is input,
the analog-to-digital conversion unit includes a first analog-to-digital converter to which an output signal of the first addition unit is input and a second analog-to-digital converter to which an output signal of the second addition unit is input,
the digital-to-analog conversion unit includes a first digital-to-analog converter to which an output signal of the first analog-to-digital converter is input and a second digital-to-analog converter to which an output signal of the second analog-to-digital converter is input,
the noise extraction circuit unit includes a first noise extraction circuit to which the input signal of the first analog-to-digital converter and an output signal of the first digital-to-analog converter are input and a second noise extraction circuit to which the input signal of the second analog-to-digital converter and an output signal of the second digital-to-analog converter are input, and wherein
an output signal of the first noise extraction circuit is input to the second addition unit and an inverted signal of an output signal of the second noise extraction circuit is input to the first addition unit.

4. The complex bandpass ΔΣAD modulator according to any one of claims 1 to 3, wherein
the analog-to-digital conversion unit includes a multibit analog-to-digital converter, and
the digital-to-analog conversion unit includes a multibit digital-to-analog converter.

5. A digital radio receiver, comprising:
a complex bandpass ΔΣAD modulator including an analog-to-digital conversion unit configured to convert an analog complex signal into a digital complex signal, a digital-to-analog conversion unit configured to convert a complex signal output from the analog-to-digital conversion unit into an analog complex signal, a subtraction unit configured to subtract a complex signal output from the digital-to-analog conversion unit from an input complex signal input from the outside, a complex bandpass filter configured to allow a signal component in a predetermined frequency band out of a complex signal output from the subtraction unit to pass through, a noise extraction circuit unit configured to extract a quantized noise signal of the analog-to-digital conversion unit based on a complex signal input to the analog-to-digital conversion unit and the complex signal output from the digital-to-analog conversion unit, delay the extracted quantized noise signal by one sample time, phase-rotate the delayed signal by a predetermined angle, and feed back the phase-rotated signal to an input side of the analog-to-digital conversion unit, and an addition unit configured to add the input complex signal, a complex signal output from the complex bandpass filter, and the complex signal output from the noise extraction circuit unit and output the added signal to the analog-to-digital conversion unit; and a decimation circuit configured to perform a predetermined decimation process on an output signal of the complex bandpass ΔΣAD modulator.

* * * * *